United States Patent [19]
Shimamura et al.

[11] Patent Number: 5,707,500
[45] Date of Patent: Jan. 13, 1998

[54] VACUUM PROCESSING EQUIPMENT, FILM COATING EQUIPMENT AND DEPOSITION METHOD

[75] Inventors: Hideaki Shimamura; Yuji Yoneoka, both of Yokohama; Shigeru Kobayashi, Hiratsuka; Satosi Kisimoto, Yokohama; Sunao Matsubara, Tokorozawa; Hiroyuki Shida, Koganei; Yukio Tanigaki, Tachikawa; Masashi Yamamoto, Yamanashi-ken; Susumu Tsuzuku, Tokyo-to; Eisuke Nishitani, Yokohama; Tokio Kato, Tokyo-to; Akira Okamoto, Chigasaki, all of Japan

[73] Assignee: Hitachi, Ltd., Tokyo, Japan

[21] Appl. No.: 467,964

[22] Filed: Jun. 6, 1995

Related U.S. Application Data

[62] Division of Ser. No. 437,683, May 9, 1995, which is a continuation of Ser. No. 18,390, Feb. 17, 1993, which is a continuation-in-part of Ser. No. 260,321, Jun. 15, 1994, which is a continuation of Ser. No. 741,526, Aug. 12, 1991, abandoned.

[30] Foreign Application Priority Data

| Feb. 17, 1992 | [JP] | Japan | 4-029185 |
| Jun. 19, 1992 | [JP] | Japan | 4-161188 |
| Nov. 24, 1992 | [JP] | Japan | 4-313079 |

[51] Int. Cl.⁶ ............................ C23C 14/54; C23C 16/00; C23F 1/02

[52] U.S. Cl. ............... 204/298.03; 156/345; 204/298.09; 204/298.25; 204/298.32; 204/298.35; 118/719; 118/724; 118/725; 118/729; 118/666; 118/667; 118/688

[58] Field of Search .................. 204/298.03, 298.09, 204/298.25, 298.26, 298.32, 298.35; 118/719, 724, 725, 729, 722, 712, 713, 666, 667, 688; 156/345

[56] References Cited

U.S. PATENT DOCUMENTS

| 4,913,790 | 4/1990 | Narita et al. | 204/298.03 |
| 4,984,902 | 1/1991 | Crowley et al. | 374/1 |
| 5,147,498 | 9/1992 | Nashimoto | 118/725 |

*Primary Examiner*—R. Bruce Breneman
*Assistant Examiner*—Rodney G. McDonald
*Attorney, Agent, or Firm*—Antonelli, Terry, Stout & Kraus, LLP.

[57] ABSTRACT

The present invention relates to vacuum processing equipment for processing a wafer in a vacuum, and film coating or forming equipment and method for forming a film on a wafer wherein radiation measurement and temperature control of the wafer is carried out by using an infrared radiation thermometer. Based upon the radiation measurement, heating and/or cooling of the wafer during processing is carried out.

9 Claims, 17 Drawing Sheets

VACUUM PROCESSING EQUIPMENT, FILM COATING EQUIPMENT AND DEPOSITION METHOD

This application us a Division of application Ser. No. 08/437,683, filed May 9, 1995, which is a continuation of U.S. application Ser. No. 08/018,390, filed Feb. 17, 1993 which is a continuation-in-part of U.S. application Ser. No. 08/260,321, filed Jun. 15, 1994, which is a continuation of U.S. application Ser. No. 07/741,526, filed Aug. 12, 1991, now abandoned.

BACKGROUND OF THE INVENTION

The present invention relates to vacuum processing equipment for processing a substrate in a vacuum, and also relates to film coating equipment and a deposition method using the vacuum processing equipment or film coating device. More particularly, the present invention relates to such a vacuum processing device and a film coating or forming device and method using the same suitable for manufacture of semiconductor devices including providing monitoring and control of process temperatures and accurate heating.

In a processing equipment to be used in manufacture of semiconductor devices, accurate control of a process temperature is important in order to realize a well controlled reaction or the like. A typical example of such a processing equipment wherein the process temperature is the most important setting condition is a furnace such as an oxidizing oven. The atmosphere in this kind of oven is an oxidative atmospheric air substituted atmosphere. This atmosphere is at an atmospheric pressure or a pressure higher than the atmospheric pressure, and a silicon wafer, as an example of a substrate, in the oven is heated by radiation from a heater provided around a quartz tube and by heat conduction through the atmospheric pressure atmosphere in the quartz tube. That is, as a medium for conducting heat is present in the quartz tube, temperature measurement can be relatively accurately effected by using a measuring element such as a thermocouple provided in the heat conductive atmosphere.

As an example not using the heat conductive medium, a photoresist baking equipment is known to be used in a step of coating a photoresist which is used as a mask in an etching step. In this equipment, wherein baking is carried out in the atmospheric pressure atmosphere, a silicon wafer is placed on a heat block heated at a predetermined baking temperature, which heat block has a heat capacity larger than that of the silicon wafer, and the silicon wafer is wholly pressed on the heat block by the atmospheric pressure by use of a vacuum chuck provided on the heat block side. Accordingly, a temperature of the wafer comes into balance with the temperature of the heat block, so that the temperature of the wafer can be accurately controlled by a temperature measuring element such as a thermocouple mounted on the heat block. As most of the semiconductor manufacturing processes utilize a highly pure material and a well controlled reaction in a non-dust environment, it is often necessary to carry out processing in a vacuum.

The use of a lamp heater for heating a Si wafer as an object has been known and a measuring and controlling technique for the temperature of a substrate (e.g., silicon wafer) will be described hereinbelow in accordance with features of the present invention. Further, a method for forming a wiring film used particularly for a semiconductor device, that is, LSI and the like will be also described.

Conventionally, accurate temperature control of the wafer in a vacuum in a semiconductor manufacturing device is essentially difficult for the following reasons.

Lamp heating is widely used for heating in a vacuum because it is inexpensive and can be easily installed within a vacuum unit. In the case where a substrate handled by a vacuum processing equipment is a Si wafer, since the Si wafer is substantially transparent in a considerably wide range of wavelength with respect to a general halogen lamp heater or the like, absorption characteristics of an infrared ray greatly varies with the characteristics of a film or the like deposited on the surface of the Si wafer and with the kind and concentration of impurities in the Si wafer, and therefore the heating characteristics considerably vary with wafers.

In the case of heating the wafer with use of a lamp heater, the wafer is heated by only radiation from the lamp heater because no heat conductive medium is present in a vacuum. Therefore, as is well known, the radiation is slightly absorbed on a metallic specular surface, while being greatly absorbed on a black body. As a result, a degree of heating of the wafer is largely dependent on a surface condition of the wafer to be heated, or on the kind of and concentrations of the impurities in the wafer.

Lamp heating is simple as previously mentioned. However, in the existing circumstances, in the case where a heating temperature is desired to be controlled even slightly by the heating treatment of the Si wafer and in the case where the kind or state of a silicon substrate are not constant, lamp heating is hardly useful.

As an applied example quite often used for heating a wafer by a lamp heater, there is a processing generally called baking in which a heating processing is carried out in order to eliminate vapor adsorbed to a silicon wafer when the silicon wafer is introduced into the vacuum device. In the baking processing, it is usual that the processing is carried out under wide conditions in order to remove vapor such that heating is carried out for one minute at a temperature, for example, from 300° C. to 400° C. or so. For such uses, a heating mechanism having a readiness of lamp heating is therefore preferable.

It has been tried to accurately measure a temperature of the wafer during processing by mounting a thermocouple on the wafer. However, since the measurement of the wafer temperature is carried out under the condition where the thermocouple is in point contact with the wafer, it is difficult to maintain a stable contact condition of the thermocouple, so that the repeatability in measurement of the wafer temperature is lacking. That is, it is required that thermocouples are in physical contact with the silicon wafer. However, since these wafers must be handled with extreme care of not being contaminated with foreign particles of substances, physical contact of the thermocouple and the wafer is not really practical for product wafers.

In the case that the wafer is heated by infrared radiation from the lamp heater, there is a possibility that the heat of the wafer is transmitted to the thermocouple by not only heat conduction, but also by radiation from the lamp heater directly or through the wafer due to its semitransparency. Accordingly, accurate measurement of the wafer temperature with use of the thermocouple is difficult.

Further, it has been proposed to forcibly bring a heat conductive medium in a vacuum. For example, there is described in Japanese Patent Laid-open Publication No. 56-48132 or 58-213434 that a silicon wafer is clamped on a heat block located in a vacuum atmosphere, and a space between the silicon wafer and the heat block is filled with a heat conducting gas under a pressure of about 1 Torr to thereby balance a temperature of the wafer to a temperature of the heat block. In this case, the temperature of the heat block can be measured by a temperature measuring element such as a thermocouple mounted on the heat block.

However, as the wafer is clamped to the heat block by a force smaller than that of a vacuum chuck under the atmospheric pressure, uniformity and repeatability of the wafer temperature to be measured are insufficient. The greatest drawback in this case is that the heat conductive medium has a low density so as to require much time for heat conduction to take place from the heat block to the wafer. As described in the above-cited publications several to tens of seconds are required until thermal balance between the heat block and the wafer is reached. Furthermore, the repeatability of the heat conduction time is considered to be influenced by various factors.

Further, in the above case where the wafer is clamped to the heat block, a clamping member is in physical contact with an upper surface of the wafer, causing contamination of the upper surface of the wafer or generation of foreign matter to reduce the yield.

Thus, there are various types of thermometers for measuring a substrate temperature in a vacuum. In an individual processing device for a silicon wafer (a device for processing wafers wafer by wafer), silicon wafers are carried within the vacuum device. Therefore, whatever heating arrangement is adopted, it is desirable to measure a temperature of the wafer in a vacuum under a non-contact condition. As an example of such non-contact measurement, it has been proposed to use an infrared radiation thermometer and measure an intensity of radiation from the wafer in remotely an infrared region.

A prior art technique related to such measurement is described in Japanese Patent Laid-Open Publication No. 1-129966, for example.

In this method, the wafer is placed on a heat stage in a sputtering equipment, and a temperature of the heated wafer is measured by the infrared radiation thermometer through a hole formed through a target located in opposition to the wafer. That is, an infrared emissivity of the wafer at a specific temperature is preliminarily measured with use of another sample for calibration, and a temperature of the wafer during sputtering is controlled according to the infrared emissivity measured above.

The greatest drawback in infrared radiation thermometer temperature measurement is that the emissivity of the object to be measured should be known beforehand. Therefore, emissivity measurement is a mandatory step for infrared radiation thermometer measurement.

Further, since the infrared radiation thermometer is generally installed in an atmospheric atmosphere, a substrate is measured through a window formed of a suitable material which causes an infrared ray to permeate. Accordingly, a construction of a seal or the like of vacuum of the vacuum processing device becomes complicated. In consideration of expenses for installation of a display unit, a control system and the like, the provision of a thermometer for accurately measuring a substrate temperature on the vacuum equipment possibly increases the price of the equipment and also increases the prices of film electronic parts to be manufactured.

Since the temperature of a substrate is to be measured in a vacuum, and since the infrared radiation thermometer is not usually able to be used in a vacuum, the thermometer itself is installed outside of the vacuum chamber, that is, in an atmospheric condition. The infrared radiation thermometer observes the substrate in the vacuum chamber through a window which has a window material with a sufficiently high transmittance for the infrared ray spectrum of concern. This window material seals the atmospheric pressure against the vacuum. Therefore, the installation of the infrared radiation thermometer usually requires an expense which may affect the final price of the product or the price of the equipment. The window material described above may have some film material deposited thereon after a long service resulting in a staining of the window material. Even in plasma etching equipment, the window surface may be attacked by etchants resulting in a rough source, or in some cases film material may be deposited onto the inside surface of the window material. These stains or the like lead to a change in the transmittance for the infrared rays, causing error in the temperature measurement.

If such a stain occurs, an occurrence of an abnormality in measurement cannot be determined by monitoring an indicated value of the thermometer. Further, even in the case where a thermometer itself has an abnormality other than the stain of the window surface, it is sometimes not always easy to determine such.

Further, the method of using the infrared radiation thermometer yet has some problems such that the emissivity of the wafer is not always constant to cause a difficulty in accurate temperature measurement as will be hereinafter described.

Another silicon wafer on which a thin film of the same metal, e.g. aluminum, as a target material is formed with a thickness of hundreds of angstroms is used as the calibration sample. A surface of the silicon wafer on which the metal film is formed is observed by the infrared radiation thermometer. However, the infrared emissivity from the surface of the wafer to be observed by the infrared radiation thermometer is dependent upon the presence of the metal film. Accordingly, temperature control of the wafer before film formation cannot be carried out.

Further, also after starting of film formation, accurate temperature measurement cannot be carried out until a desired film thickness (e.g., hundreds of angstroms) of a metal film (e.g., aluminum film) is reached.

Further, even when the same metal film is formed on the wafer as the calibration sample and the wafer to be actually processed, the infrared emissivities of the wafers are different from each other in dependence upon different product lots of the wafers. Accordingly, accurate temperature measurement and control of the wafer to be actually subjected to vacuum processing cannot be effected. Although the conventional vacuum processing device employs various temperature control arrangements as mentioned above, a process temperature cannot be accurately determined and controlled.

Further, in a semiconductor material such as a silicon wafer, the infrared emissivity increases with an increase in temperature. This is due to the fact that a density of free carriers increases with an increase in temperature (i.e., metallization) to cause an increase in radiation and absorption. Details in this respect are mentioned in T. Sato; Japanese Journal of Applied Physics, Vol. 6, No. 3 (1967).

To cope with such a change in emissivity with a change in temperature, it is necessary to correct the emissivities at a plurality of temperatures in the case of effecting temperature measurement with a high accuracy. To effect this correction, it may be carried out to preliminarily measure the emissivities at the plural temperatures in a temperature range to be measured. However, such preliminary measurement of the emissivities at the plural temperatures requires additional heating which unduly increases the number of steps in the process.

That is, an ideal method for temperature control of the wafer with use of the infrared radiation thermometer is to calibrate the infrared radiation thermometer by using the wafer to be actually subjected to film formation processing and measure a temperature of the wafer irrespective of a difference in infrared emissivity due to the presence or absence of a film or the condition of the film. However, no practically applicable devices capable of realizing this ideal method have yet been proposed.

Further, in a vacuum processing device having a plurality of vacuum processing chambers and a so-called multiple chamber type vacuum processing device having a plurality of vacuum processing chambers arranged around a carrier chamber, there are the following problems in the case of installing a temperature measuring mechanism in the vacuum processing chambers themselves. That is, (1) hindrance due to penetration of thermal noise from a heat source in each vacuum processing chamber; (2) reduction in vacuum performance of each vacuum processing chamber, e.g., an increase in leak potential; (3) contamination of an optical system and generation of dust due to rounding of film formation particles; (4) necessity of modification of a design specification of a vacuum device such as a substrate holder for placing the substrate in each vacuum processing chamber in the case of utilizing an existing vacuum processing device; (5) an economic problem such that a plurality of temperature measuring mechanisms must be installed correspondingly to the vacuum processing chamber.

A most difficult problem in the application of infrared radiation temperature measurement of semitransparent substrates such as Si wafers to process equipment, such as sputter deposition, plasma etching, or CVD equipment, in which the process changes the emissivity of the substrate, is that the emissivity of the wafer after processing or during a processing cannot be known beforehand. As such, time temperature measurement is not possible. For metal deposition processing of a metal film or coating onto Si wafers in sputter deposition equipment, the emissivity of the wafer changes considerably upon metal deposition. Before metal deposition, the infrared radiation occurs on both sides of the wafer. However, upon metal deposition on one side, there results a mirror-like effect on this side and, hence, the radiation does not occur on this metallized side. The radiation from unmetallized side may change accordingly. This change in the emissivity cannot be known before the deposition and no practically applicable techniques have been considered in the prior art.

In consideration of a solution of a disadvantage in a low level of controllability in the case where a lamp heater as mentioned above is used for heating a Si wafer, it is most understandable to carry out measurement of a wafer temperature during heating at real time. However, for example, when an infrared thermometer is used as the thermometer, a light of high brightness from the lamp heater enters as stray light into the infrared thermometer, giving rise to a problem that it is difficult to perform natural measurement. Furthermore, even if a technique can be applied in which such a thermometer is mounted without being affected by the stray light, the available readiness of a lamp heating is possibly impaired.

In examining the absorption characteristics of the Si wafer before carrying out the lamp heating, this must be achieved by a simple technique. If a device which increases the price of the device itself is added in order to examine the absorption characteristics of the Si wafer, the aforementioned readiness of the lamp heater is possibly impaired. Accordingly, a technique is required which adjusts a temperature matching to the characteristics of Si wafer without impairing the readiness of the lamp heater as the heating source.

When a temperature of a substrate such as a silicon wafer during film deposition by a sputtering equipment or the like for a film deposition is measured, the step of a film deposition is executed. Therefore, a prudent measure so as not to stain the aforementioned window material should be adopted. In addition, even in an etching device, a film is sometimes formed on a part of a vacuum unit in dependence upon the reaction gas and the process conditions of etching.

In consideration of the case where when the rear surface of a silicon wafer during film deposition is observed by an infrared radiation thermometer, the silicon wafer is placed in close contact with the stage and an observation hole of the infrared radiation thermometer is present in a central potion of the stage, if the wafer is well placed in close contact therewith, film forming particles get mixed into the observation hole during film forming and the observation window material should not be stained. However, the staining of the observation window material sometimes gradually proceeds due to an abnormality of a contact degree or the like.

The technique for preventing a stain, a damage or the like of the window material is important but the technique for precisely knowing the occurrence of such abnormality is similarly necessary. Also in the case where an abnormality in the thermometer itself should occur, it is necessary to precisely know such fact as described to prevent an occurrence of defective products caused by the inaccurate measurement of temperature.

SUMMARY OF THE INVENTION

It is accordingly an object of the present invention to solve the above problems in the prior art.

It is another object of the present invention to provide an improved vacuum processing device which can accurately measure and control a temperature of a substrate in a vacuum.

It is a further object of the present invention to provide an improved film coating or forming equipment such as a sputtering equipment and a CVD (Chemical Vapor Deposition) device using the above vacuum processing device.

It is another object of the present invention to provide a film coating or forming method utilizing the film coating or deposition device of the present invention.

It is a further object of the present invention to provide equipment utilized with the vacuum processing equipment or film desposition equipment which enable detection of a failure or abnormality in temperature sensing such as a malfunction in the thermometer or window contamination.

It is still another object of the present invention to provide a vacuum processing equipment enabling improved controllability where a substrate such as a silicon wafer is heated in a vacuum by a lamp heater and for obtaining high quality and high productivity such as film deposition by way of sputtering.

In accordance with a feature of the present invention, an infrared radiation thermometer is used as primary source for measuring a temperature of each substrate (e.g., silicon wafer), so that the thermometer is calibrated for every substrate. More specifically, before processing the substrate in a vacuum processing equipment, radiation from the substrate is measured at least one temperature by a first infrared radiation thermometer, which output signal thereof is transferred to a second radiation thermometer to provide information for temperature conversion from the output signal of the second thermometer. A correction value may be an emissivity or, for some small range of temperature, a relation constant. For higher accuracy purposes, or in the case the emissivity changes greatly with temperature, the radiation measurement by the first thermometer maybe carried out for multiple temperatures. A table which shows the relation between the real temperature and the output signal from the second thermometer may be utilized in a computer software to give the exact temperature.

The temperature calibration stage may be present in the environment of atmospheric pressure instead of a vacuum. In the environment of atmospheric pressure, a structure of the device can be made simple in general. Furthermore, in the case of heating or cooling a substrate temperature to a known temperature, the substrate temperature (wafer temperature) can be easily approached to a temperature of a heat block (stage).

More specifically, in the case of setting the temperature calibration chamber under atmospheric pressure, the substrate may be brought into close contact with the heat block having a heat capacity larger than that of the substrate by using a vacuum chuck. In this case, the substrate temperature can be approached to the heat block temperature more accurately and in a short time. Even in the case of not performing positive heating or cooling with use of the heat block, the use of the vacuum chuck enables the substrate temperature to be quickly balanced with a stage temperature (i.e., environment or room temperature: 20° C.). Moreover, the vacuum chuck may be replaced by an electrostatic chuck (utilizing lines of electrostatic force).

In the case that a calibration temperature is required to be set at a high temperature, there will occur a problem that a surface of the substrate is oxidized in dependence upon the atmosphere. Accordingly, it is more preferable that the atmosphere in the temperature calibration chamber is replaced by an atmospheric air, e.g., nitrogen or argon atmosphere.

When setting the temperature calibration chamber under a vacuum, a heating or cooling gas as a heat conductive medium is interposed under the pressure of 5 Pa or more between the heat block and the substrate, so as to improve heat conduction therebetween, whereby the substrate temperature can be approached to the heat block temperature in a relatively short time.

In a vacuum processing equipment for forming a thin film on the substrate by sputtering, when the substrate in the atmospheric air is taken into a vacuum processing unit of the equipment, it is sometimes necessary to heat the substrate up to 150° C. or more, so as to sufficiently remove moisture adsorbed on a surface of the substrate, or heat the substrate prior to deposition so as to retain a high substrate temperature during deposition, or cool the hot substrate down to a film formation start temperature of about 50° C. in the vacuum processing unit. In each case of heating and cooling of the substrate, it is necessary to accurately measure a temperature of the substrate every time of temperature control, and it is accordingly necessary to preliminarily calibrate the infrared radiation thermometer for measuring the temperature of every substrate.

According to the present invention, there is provided a film depositing equipment such as a sputtering equipment or a CVD equipment which is required to accurately control a substrate temperature. The film depositing equipment is capable of controlling the substrate temperature to a known temperature before performing predetermined vacuum processing, measuring radiation from a corresponding substrate to predict the emissivity when the wafer undergoes deposition, or after deposition, or in the case that a specular reflector is placed in closed proximity to the substrate or wafer, or measuring an emissivity of the substrate by using a first infrared radiation thermometer, and calibrating a single second infrared radiation thermometer or a plurality of second infrared radiation thermometers to be used in the subsequent vacuum processing steps and having a function to transfer the correction value to the second thermometer, on the basis of the result of measurement, whereby the vacuum processing steps can be more suitably applied to electronic parts.

In general, an infrared radiation characteristic of a substance is dependent upon a wavelength. Therefore, more accurate calibration can be effected by adopting the same wavelength of the infrared region for the measurements by the first and second infrared radiation thermometers.

When carrying out the measurement of the emissivity of the substrate heated to a known temperature with use of the first infrared radiation thermometer, heating of the substrate to the known temperature in a vacuum makes it possible to obviate a so-called baking step for removing moisture adsorbed on the substrate. Accordingly, it is sometimes advantageous that the equipment can be reduced in scale.

When heating the substrate in a vacuum processing chamber of a sputtering equipment, if the infrared radiation thermometer is preliminarily calibrated, a lamp may be used instead of a heat block to effect radiation heating, thereby reducing the cost of the sputtering equipment.

In the case of using a silicon wafer as the substrate, the silicon wafer cannot be efficiently heated by an infrared lamp including quartz glass, which is generally widely used, because the silicon wafer is almost transparent to such infrared region. Further, this kind of infrared lamp tends to generate stray light to the infrared radiation thermometer. Therefore, it is more preferable to use a heating lamp capable of generating radiation of short wavelength so as to be efficiently absorbed by the silicon wafer.

In the case that a film deposition start temperature of the substrate in the vacuum processing chamber is lower than a baking temperature of the substrate in a vacuum for removing moisture adsorbed on the substrate, it is necessary to cool the substrate in a vacuum unit after baking and adjust the substrate temperature to the predetermined film deposition start temperature. To realize such a film formation process with high accuracy, the present invention provides a sputtering equipment including a stage having a first infrared radiation thermometer for performing temperature calibration in a temperature calibration chamber, a stage for performing baking of the substrate in a vacuum, a stage for cooling the substrate to a predetermined film deposition temperature prior to starting film formation, and a second infrared radiation thermometer capable of automatically accurately measuring the substrate temperature on the cooling stage by using a correction value computed on the basis of an emissivity obtained by the first infrared radiation thermometer.

Once a metal layer is formed on the substrate, the infrared radiation which was emitted to this metallized side will be reflected back to the other side of the substrate. This metallized side will be referred to as the front surface and this unmetallized side as the back side of the substrate hereafter. In the case an infrared thermometer is installed in the backside of the wafer, the emissivity observed by this thermometer changes greatly upon metal deposition. Further, semitransparent substances such as Si wafers change emissivity dramatically during processing and the emissivity during or after the processing is not obtainable prior to the processing. For this reason the infrared radiation thermometer has not yet been adapted widely for the semitransparent substrate processing.

Further in the heating or cooling stage, the infrared radiation thermometer observes the backside of the substrate through a window which is set in the back side of the substrate. In the case that a mirror is placed in the front side of the substrate, this mirror eliminates the stray light which comes through the wafer, and enables the radiation measurement under an identical condition as the wafer under deposition. This mirror surface has to be smooth enough for the wavelength of interest. Accordingly, stray light which enters the infrared radiation thermometer through the substrate can be shielded by the shutter mechanism.

Further, sometimes staining of the observation window occurs resulting in inaccurate measurement and the present invention enables a determination of the possibility of such staining or inaccuracies in temperature measurement.

Further, according to the present invention, for solving a problem in practical use in a multiple chamber type film depositing device, there is provided a vacuum processing device including a vacuum processing chamber having an arrangement for heating or cooling the substrate to a predetermined set temperature, a vacuum film deposition chamber having an arrangement for deposition a film on the substrate in a vacuum, a carrier chamber having a carrier robot for carrying the substrate to the vacuum processing chamber or the vacuum film deposition chamber, an infrared radiation thermometer for measuring an emissivity of the substrate in the carrier chamber, and a reflector faced to the substrate and having a specular surface such as a mirror capable of reflecting a radiation heat in a wavelength region to be measured by the infrared radiation thermometer. Furthermore, there is provided a film forming method including the steps of loading the substrate to a vacuum processing equipment, then moving the substrate into a carrier chamber, then moving the substrate from the carrier chamber into a vacuum processing chamber, then performing predetermined vacuum processing of the substrate in the vacuum processing chamber, and then measuring a temperature of the substrate in the carrier chamber. The above-mentioned vacuum processing includes the steps of heating or cooling the substrate, cleaning the substrate, and forming a thin film on the substrate. One of these steps may be adopted, or these steps may be adopted in combination.

It is naturally desirable to employ a non-contact measuring method to measure a temperature of a substrate such as a wafer within a vacuum processing device. The only practical device for such a method as described is an infrared radiation thermometer. An example of application of an infrared radiation thermometer to a vacuum processing device is described in the copending application Ser. No. 741,526. However, since the infrared radiation characteristics of a substrate are different one by one, it is necessary to know the radiation characteristics of the substrates by some method to carry out the operation for setting an emissivity (of an object to be measured) in association with the infrared radiation thermometer for adjusting the value thereof. This operation is hereinafter referred to as calibration of emissivity. That calibration of the emissivity which is required is the greatest disadvantage of the infrared radiation thermometer. Additionally, calibration is sometimes difficult in dependence of the characteristics of an object to be measured. Further, a device provided with an infrared radiation thermometer for measuring a non-contact temperature of a substrate is necessarily provided with apparatus for determining emissivity without fail and it is known that an emissivity of an object is conversely an absorption rate of an object.

According to a feature of the present invention, heating power or heating time of a lamp heater is predetermined using the emissivity to thereby make it possible to improve a temperature controllability of heating by the lamp. That is, a high absorption rate can be expected for a wafer of high emissivity, and therefore the heating power or heating time is set to be small while a low absorption rate is expected for a wafer of small emissivity, and therefore the heating power is set to be large and the heating time is set to be long. In this way, heating with high accuracy can be executed without impairing the readiness of lamp heating.

The temperature of the Si wafer during sputter deposition is one of the moat important parameters which determine the characteristics of films. If a sputter deposition equipment is assumed in which the temperature of the substrate, such as the Si wafer can be measured by infrared radiation thermometers, as discussed above, such sputtering equipment should have a unit to know the infrared emissivity of the substrate before this substrate is brought into the process chambers, and the emissivity during the deposition may be measured by the first infrared thermometer. The substrate temperature is monitored by the second infrared radiation thermometer. Sputtering devices used for LSI fabrication such as aluminum deposition usually have a baking process in which the Si wafer is heated so that the absorbed water vapor is forcibly evaporated from the wafer. This heating is in many cases done by lamp heaters for the simplicity and cost reasons. The wafer is transferred to the deposition chamber when the baking process is finished. Therefore the wafer temperature at the beginning of the deposition is mostly determined by the final temperature in the baking process. Although it would be advantageous if the baking temperature control is provided for the lamp heaters which generally have poor temperature controllability for Si wafers, another thermometer and its controller, or the complexity of the installation of the thermometer would lead the higher cost for the sputtering device.

In a vacuum processing device provided with a plurality of thermometers according to the present invention, even if a thermometer for a substrate is not installed at a place where lamp heating is carried out, for example, a time for carrying the substrate to a thermometer installed at the other place is known, and a temperature drop after termination of heating can be calculated to monitor whether or not heating was normally carried out. In general, in a device provided with a plurality of infrared thermometers according to the present invention, temperatures of substrates are measure by two or more thermometers to monitor whether or not they are in a rational relationship, and the normal operation of the thermometers can be monitored.

In the device configuration in which a vacuum unit for carriage and a device for carrying a substrate from the vacuum unit for carriage to a processing unit for each vacuum processing are connected to each other, one or more thermometers are installed on the vacuum unit for carriage, so that a temperature of the substrate is measured before carrying the substrate to a vacuum processing chamber and when the substrate is carried out of the processing unit after termination of said processing, whereby in order to make the number of thermometers installed the least number possible, one thermometer is installed on each vacuum unit for carriage to enable a reduction of the total number of thermometers.

Suitable heating is applied to a substrate such as a Si wafer before carrying out film forming using a simple lamp heating whereby semiconductor devices having an reproducible characteristic can be manufactured.

According to another feature of the present invention, a device provided with an infrared radiation thermometer for non-contact measurement of a temperature of a substrate is provided with apparatus for determining emissivity without fail. If the emissivity of a substrate is known, heating power or heating time of a lamp heater can be preset. That is, for a wafer of high emissivity, a high absorption rate is expected and the heating power or heating time is set to be small, while for a wafer of small emissivity, the heating power is set to be large or the heating time is set to be long. In this way, heating with high accuracy is executed without impairing the readiness of lamp heating.

Accordingly, the present invention enables carrying out calibration of an infrared radiation thermometer and providing information of expected absorption characteristics resulting from lamp heating of the substrate. The operating conditions of the lamp heater experimentally obtained in advance with respect to the emissivity of the substrate are examined, and proper heating conditions by the lamp heater are set with respect to a power source of the lamp heater.

For monitoring thermometers in the vacuum processing device, a temperature of a substrate rises or falls without fail, and therefore, the results of a plurality of thermometers can be directly compared and judged at once. For this reason, it is necessary to provide a mechanism in which what temperature history occurs in a substrate during measurement by a plurality of thermometers is known, and particularly in a natural cooling during carriage of the substrate, a temperature drop caused thereby is calculated to compare rationalities of measured results by the plurality of thermometers.

Prior to predetermined vacuum processing of the substrate in the vacuum processing chamber, the substrate is heated or cooled to a known temperature in the temperature calibration chamber, and the radiation from the backside of the substrate is measured by the first infrared radiation thermometer. Then, on the basis of the result of measurement, the correction value of the first infrared radiation thermometer is computed for the second and the following infrared radiation thermometers, that is, the emissivity of the substrate under deposition or after deposition. Then, on the basis of the result of computation, a temperature of the substrate in the subsequent vacuum processing chamber is accurately measured by a second infrared radiation thermometer. Then, on the basis of the result of measurement, a temperature control system is operated to set the temperature of the substrate in the vacuum processing chamber to a predetermined value, and the vacuum processing such as film formation is carried out under the condition where the temperature of the substrate is accurately controlled.

In the present invention, the provision of the reflection or mirror shutter in the proximity to the substrate at the time of measurement of the substrate temperature has several important roles for the accurate measurement of the substrate temperature. That is, the first important role is that only with this mirror shutter the emissivity of the substrate under deposition can be measured before the substrate has a film actually deposited thereon, and thus, the shutter makes it possible to measure the substrate temperature in a real time manner. Therefore the shutter makes it possible to attain proper temperature controllability. Furthermore the mirror shutter shields stray light entering the infrared radiation thermometer through the substrate, and thereby prevents measurement error due to the stray light. Additionally, this shutter mechanism is essentially necessary for prediction of the emissivity of a substrate under or after film deposition.

These and other objects, features, and advantages of the present invention will become more apparent from the following description when taken in conjunction with the accompanying drawings which show, for purposes of illustration only, several embodiments of the present invention.

DESCRIPTION OF THE PREFERRED EMBODIMENTS

Figure 1:
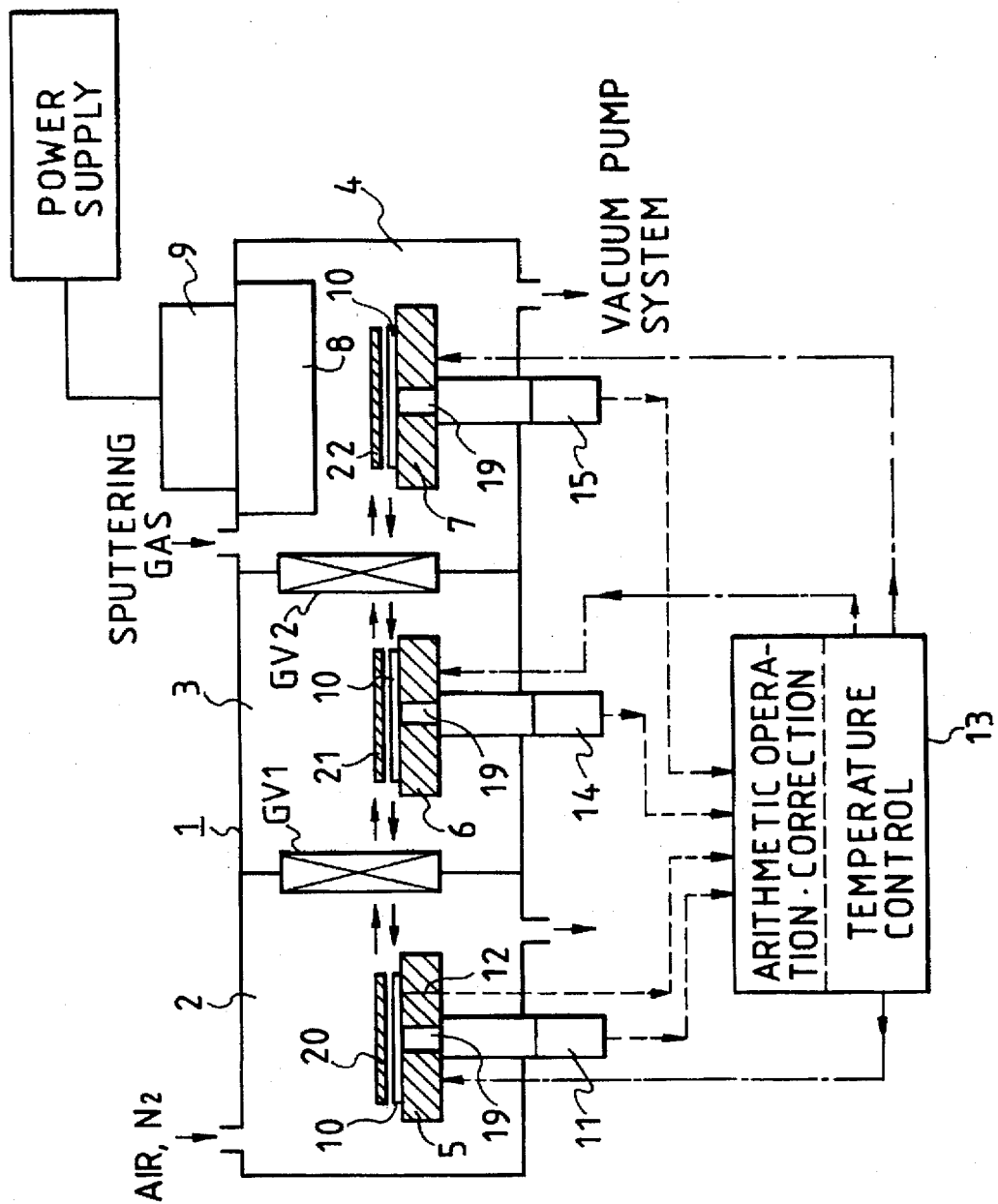
FIG. 1 is a partially sectional block diagram illustrating a schematic construction of a vacuum processing device according to an embodiment of the present invention.

Referring now to the drawings wherein like reference numerals designate like parts throughout the views, FIG. 1 shows a schematic construction of a sputtering device of the vacuum processing device according to the present invention, wherein a silicon wafer is used as a wafer to be subjected to film formation processing, and an Al thin film is to be formed on the silicon wafer by sputtering. The vacuum processing device 1 comprises a wafer temperature calibration chamber 2 including a wafer temperature calibration stage 5, a wafer temperature adjusting chamber 3 including a wafer temperature adjusting stage 6 for heating and cooling a wafer 10, and a sputtering chamber 4 including a sputtering stage 7, an Al target 8 and a sputtering electrode 9. These chambers 2, 3 and 4 are independently defined and connected with each other through gate valves GV1 and GV2. Each of the chambers 2, 3 and 4 is formed with an evacuation port connected to an evacuation system for evacuating each chamber to maintain a predetermined vacuum condition in each chamber. On the other hand, each of the chambers 2, 3 and 4 is formed with a gas introducing port connected to a gas source for supplying a predetermined gas into each chamber. For example, atmospheric air or a nitrogen gas is introduced into the wafer temperature calibration chamber 2 to obtain an air or nitrogen substituted atmosphere under an atmospheric pressure. Further, a sputtering gas is introduced into the sputtering chamber 4 to obtain an environment where plasma can be generated by predetermined discharge. Further, each of the stages 5, 6 and 7 is provided with heating and cooling arrangements to be hereinafter described and an observation window 19 as a through hole through which infrared radiation radiating from the wafer 10 is observed. First, second and third infrared radiation thermometers 11, 14 and 15 are optically connected with the respective observation windows 19 of the stages 5, 6 and 7. Shutters 20, 21 and 22 are provided over the wafers 10 placed on the stages 5, 6 and 7 in the proximity thereto, respectively. Each of the shutters 20 and 21 has a principal surface opposite to or facing the wafer capable of effecting sufficient specular reflection of a wavelength of infrared radiation to be measured by each of the infrared radiation thermometers 11, 14 and 15.

The wafer temperature calibration stage 5 is provided with a thermocouple 12 for accurately measuring a temperature of the stage 5. The thermocouple 12 and the first, second and third infrared radiation thermometers 11, 14 and 15 are electrically connected to a wafer temperature controller 13. The wafer temperature controller 13 receives an output from the thermocouple 12 and an infrared radiation of the wafer 10 measured by the first infrared radiation thermometer 11, a unit for computing and predicting the infrared emissivities of the wafers 10 under deposition or after the deposition as a function of temperatures of the wafer 10 in a temperature range to be measured, on the basis of the infrared emissivities for the wafer under deposition or after deposition or on the basis of the infrared emissivities measured above for the wafer under deposition or after deposition estimated above as the function of the temperatures of the wafers 10, thereby measuring accurate temperatures of the wafers 10 on the stages 5, 6 and 7. Further, the wafer temperature controller 13 is connected to the heating and cooling arrangements provided in the stages 5, 6 and 7, so as to feed back to the heating and cooling arrangements a command for setting temperatures of the stages 5, 6 and 7 to predetermined values according to the measured data obtained above, thereby controlling the temperatures of the stages 5, 6 and 7 to the predetermined values. Thus, the wafer temperature controller 13 functions to control temperatures in the vacuum processing device 1 as a whole.

The functions of the chambers 2, 3 and 4 will now be described. The wafer temperature calibration chamber 2 has a function of maintaining the wafer 10 placed on the calibration stage 5 at an environment temperature which is normally the same as a temperature of the calibration stage 5 such as room temperature, estimating an infrared emissivity of the wafer 10 under deposition or after deposition as a function of wafer temperatures, and obtaining a relation peculiar to the wafer 10 between an electrical output from the thermometer 11 and a temperature.

The wafer temperature adjusting chamber 3 has a function of adjusting a temperature of the wafer 10 before the wafer 10 is carried into the subsequent sputtering chamber 4. The sputtering chamber 4 has a function of forming a thin film on the wafer 10 by sputtering.

There will now be described a specific example wherein an Al thin film is to be formed on the wafer 10 by sputtering using the Al target 8 under the condition where a temperature of each stage is controlled to maintain each wafer 10 at a predetermined temperature.

In the wafer temperature calibration chamber 2 maintained in a vacuum atmosphere, the wafer 10 is brought into contact with the calibration stage 5 by an electrostatic chuck mechanism, and an Ar gas as a heat conductive medium is introduced under the pressure of 5 Pa into a space between the calibration stage 5 and the wafer 10 by a gas introducing mechanism (not shown) to control a temperature of the wafer 10 to an environment temperature or room temperature of 20° C. Then, a temperature of a lower surface of the wafer 10 is observed and measured by the first infrared radiation thermometer 11 and the thermocouple 12. On the basis of the result of measurement, an infrared emissivity of the wafer 10 under deposition or after deposition or in the case of a specular reflector placed in close proximity to the wafer is obtained as a function of temperature, and a relation peculiar to the wafer 10 between an output from the thermometer 11 and a temperature of the wafer 10 is computed by an arithmetic section of the wafer temperature controller 13, thus preparing a thermometer output—temperature conversion table. The emissivity and the thermometer output—temperature conversion table will be hereinafter described in detail.

Subsequently, in the wafer temperature adjusting chamber 3 and the sputtering chamber 4, processing temperatures of the wafer 10 are obtained by converting electrical outputs from the second and third infrared radiation thermometers 14 and 15 into temperatures with use of the thermometer output—temperature conversion table previously prepared.

The wafer temperature controller 13 also determines which stage the wafer 10 subjected to temperature measurement on the calibration stage 5 is now carried to and placed on, and measures a temperature of the wafer 10 now placed on this stage with use of the thermometer output—temperature conversion table.

After ending the calibration of the emissivity for the wafer under deposition or after deposition, or in the case of a specular reflector placed in close proximity to the wafer by the first infrared radiation thermometer 11, the gate valve GV1 is opened to carry the wafer 10 from the stage 5 in the calibration chamber 2 to the stage 6 in the wafer temperature adjusting chamber 3 and measure a temperature of the wafer 10 placed on the stage 6 by the second infrared radiation thermometer 14. According to the result of measurement, a temperature of the stage 6 is adjusted by the wafer temperature controller 13 to adjust the temperature of the wafer 10 to an arbitrary predetermined temperature, e.g., 100° C. Thereafter, the gate valve GV2 is opened to carry the wafer 10 from the stage 6 in the wafer temperature adjusting chamber 3 to the stage 7 in the sputtering chamber 4 which is maintained in a vacuum condition and to effect measurement of a temperature of the wafer 10 by means of the third infrared radiation thermometer 15. According to the result of measurement, a temperature of the stage 7 is adjusted by the wafer temperature controller 13 to control the temperature of the wafer 10 to an arbitrary predetermined temperature, e.g., 250° C. At this controlled temperature, Al sputtering is carried out to form an Al thin film on the wafer 10 placed on the stage 7. As to any wafers (not shown) other than the wafer 10, a thermometer output—temperature under deposition or after deposition conversion table peculiar to each of the other wafers is prepared in the same manner as the above, and a temperature of each of the other wafers is measured and controlled with use of the thermometer output—temperature conversion table prepared above.

As mentioned above, it is essentially necessary to individually calibrate the emissivity of each wafer. In the case of using an infrared radiation thermometer for detecting a wavelength region opaque to a material, the emissivity does not change irrespective of the presence or absence of a metal film on an upper surface of the wafer, so that the emissivity can be measured and corrected without mirror shutter. Accordingly, in this case, temperature measurement in all the chambers of the vacuum processing device is carried out without using the mirror shutters.

As a simple arrangement for carrying the wafer 10 among the chambers 2, 3 and 4, a carrier mechanism using a heat resistant belt such as a silicone rubber belt may be used.

There will now be described a structure of the wafer temperature adjusting stage 6 for placing the wafer 10 thereon, a heating and cooling method for the stage 6, and a measuring method for the emissivity of the wafer 10 on the stage 5 with reference to FIGS. 2 and 3.

(1) The structure of the stage 6 and the heating and cooling method therefor

Figure 2:
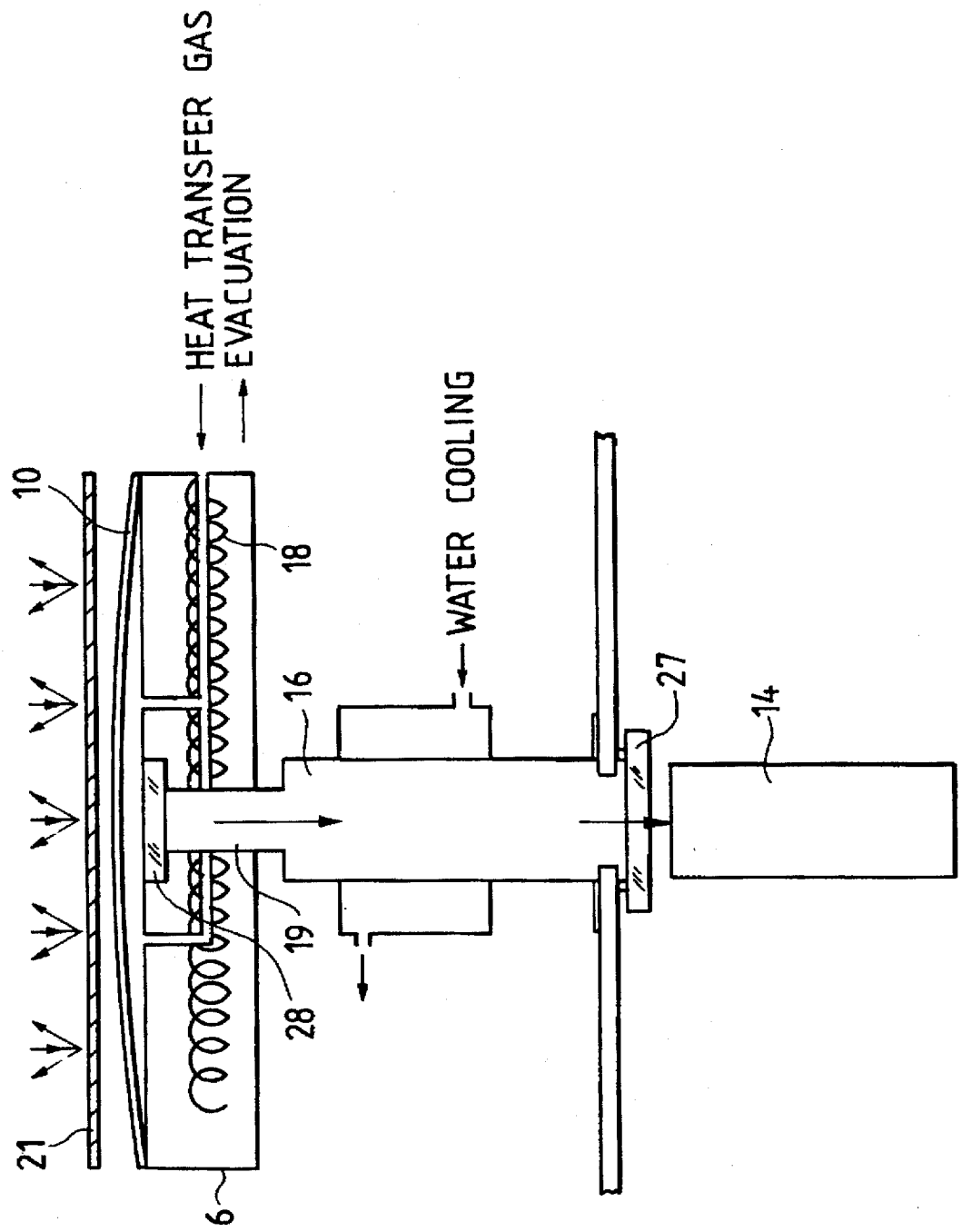
FIG. 2 is a sectional view of a wafer temperature adjusting stage shown in FIG. 1.

Referring to FIG. 2, a heater 18 is installed in the stage 6, and a heating conducting gas is introduced into a space between the stage 6 and the wafer 10 in a vacuum atmosphere. A cylinder 16 for guiding infrared radiation from the wafer 10 to the infrared radiation thermometer 14 and shielding stray light is connected with the observation window 19 formed through the stage 6 for allowing the infrared radiation thermometer 14 to measure a temperature of the wafer 10. A pair of window plates 27 and 28 formed of a material capable of transmitting the infrared radiation are mounted on opposite ends of the cylinder 16. The cylinder 16 is cooled so that it is prevented from being heated to become stray light generating source. The adverse effect of a stray light can be further reduced by forming a specular surface on an inner wall of the cylinder 16. Further, the mirror shutter 21 is provided over the wafer 10 in opposed relationship thereto. The mirror shutter 21 may have any structure meeting the requirements that (1) it has a specular surface having a reflectivity to infrared radiation and (2) it has a function of shielding a stray light. For example, the mirror shutter 21 may be operably driven in synchronism with a timing of temperature measurement of the wafer 10, or the mirror shutter 21 may be fixed in a certain area of the chamber and the wafer 10 may be moved to a position under the shutter 21 at the temperature measurement timing. Further, an electrostatic chuck may be used as the means for bringing the wafer 10 into contact with the stage 6. Further, in the case of cooling the wafer 10, the heater 18 may be replaced by a cooling mechanism provided in the stage 6. According to the above structure, there exists no physically contacting element on the upper surface of the wafer 10, so that contamination of the upper surface of the wafer 10 can be eliminated, and possible generation of foreign matter can be greatly suppressed.

(2) The measuring method for the emissivity

As shown in FIG. 1, the infrared radiation thermometers 11, 14 and 15 are located below the stages 5, 6 and 7, respectively, so as to measure the radiation of the lower surface of the wafers 10 placed on the stages 5, 6 and 7. Further, the cylinder 16 is interposed between each stage and the corresponding infrared radiation thermometer, so as to prevent a stray light in each chamber from entering the corresponding infrared radiation thermometer. Further, in measuring the temperatures of the wafers 10, the shutters 20 and 21 capable of reflecting infrared radiation are located over the wafers 10 placed on the stages 5, 6 and 7 in the proximity to the upper surfaces of the wafers 10 opposite to the lower surfaces thereof to be observed by the infrared radiation thermometers 11, 14 and 15, respectively.

In measuring the emissivity of the wafer 10 on the stage 5 for emissivity prediction when the wafer undergoes deposition or after deposition or in the case a specular reflector is placed in close proximity to the wafer, it is effective to control the temperature of the wafer 10 to an environment temperature (room temperature) without heating so that the subsequent processing of the wafers 10 on the stages 6 and 7 may not be affected. Therefore, the measurement of the emissivity of the wafer 10 deposition or in the case that a specular reflector is placed in close proximity to the wafer, with a high S/N ratio is indispensable. FIG. 3 shows a construction of the calibration stage 5 enabling the measurement of the infrared radiation for the emissivity prediction under deposition or after deposition, or in the case that a specular reflector is placed in close proximity to the wafer with a high S/N ratio at the environment temperature (room temperature).

Figure 3:
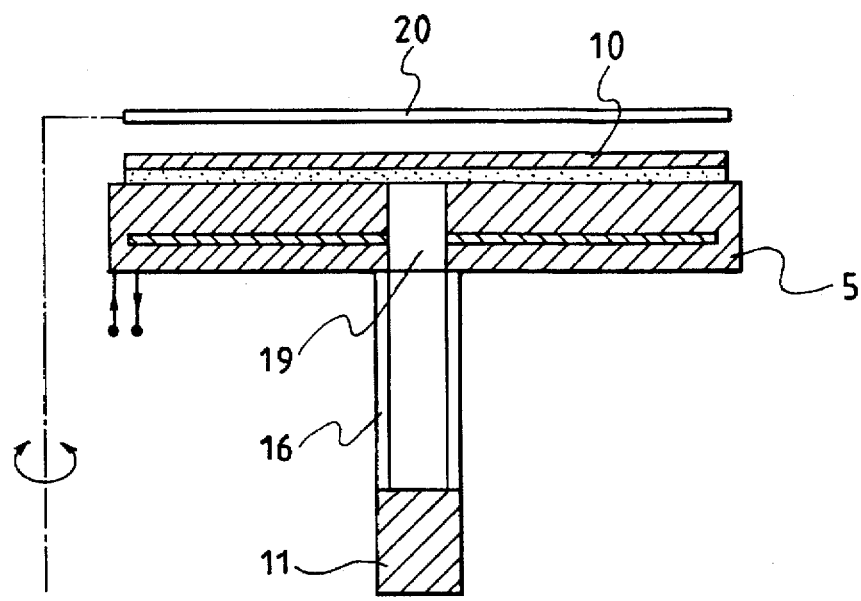
FIG. 3 is a sectional view of a wafer temperature calibration stage shown in FIG. 1.

As shown in FIG. 3, the wafer 10 is placed on the calibration stage 5 by an electrostatic chuck and is maintained at a predetermined temperature. This temperature can be an environment temperature or an elevated temperature such as 200° C. The radiation level from the wafer is low when the temperature is low, and some measure is required to attain the good signal to noise ratio in the measurement. The cylinder 16 is connected with the observation window 19 formed through the stage 5. An inner wall surface of the cylinder 16 is formed as a specular surface, so as to prevent generation and entrance of infrared radiation (stray light) affecting the measurement. Further, in carrying out the measurement, the shutter 20 capable of reflecting infrared radiation is located in the proximity to the upper surface of the wafer 10 opposite to the lower surface thereof to be observed by the infrared radiation thermometer 11, so as to prevent generation of infrared radiation (stray light) affecting the measurement. Further, in order to prevent infrared radiation from the infrared radiation thermometer 11 itself, the thermometer 11 is cooled to be controlled at a low temperature, preferably 0° C. or lower. Similarly, the cylinder 16 and the mirror shutter 20 are also controlled at a low temperature to suppress the stray light by infrared radiation to a sufficiently ignorable extent as compared with the infrared radiation from the wafer 10 maintained at an environment temperature (room temperature: normally about 20° C.).

In the case of requiring highly accurate temperature measurement and control as in performing tungsten—CVD, an emissivity measuring temperature is see to be equal to a CVD temperature, so as to control a film forming speed with a high accuracy. As a result, highly accurate correction of the thermometer 11 can be realized to thereby effect highly accurate temperature control.

Figure 4:
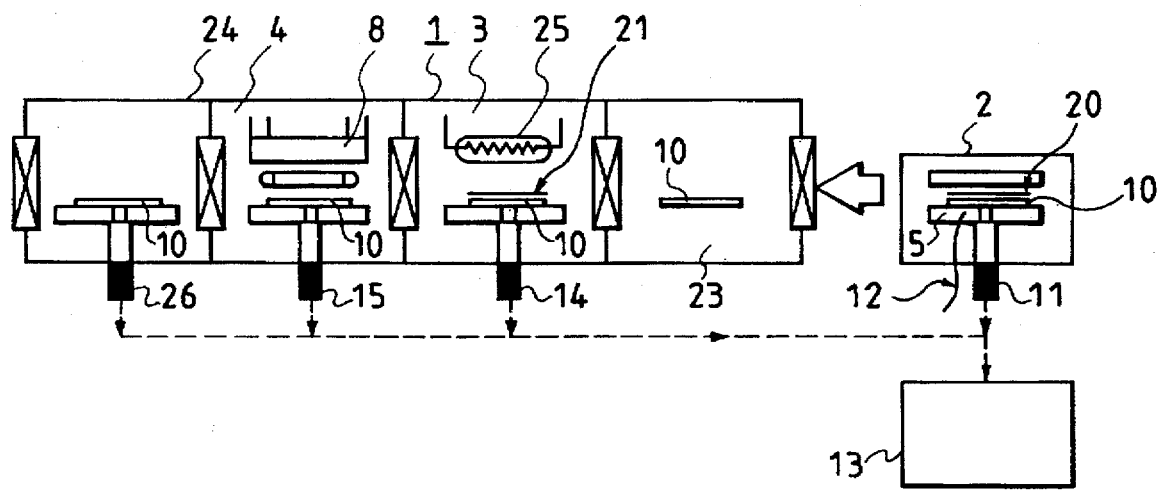
FIG. 4 is a sectional block diagram illustrating a schematic construction of a vacuum processing device according to another embodiment of the present invention.
Figure 5:
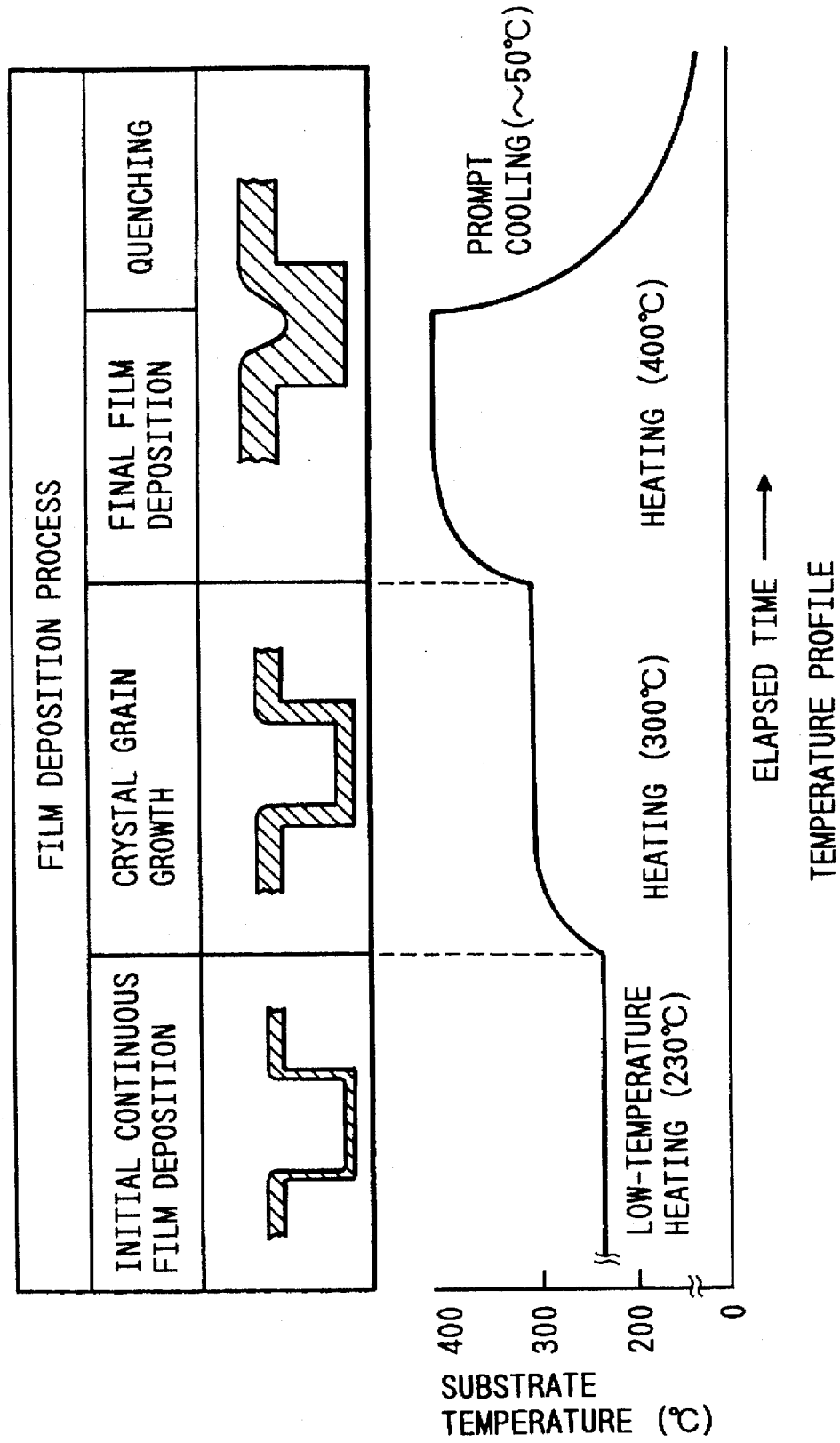
FIG. 5 is a graph showing a temperature profile during film formation.

FIG. 4 shows a schematic construction of another embodiment of the sputtering device according to the present invention. In a temperature calibration chamber 2, a temperature of a wafer 10 is measured by a thermocouple 12, and an emissivity of the wafer 10 when it undergoes deposition or after deposition is predicted on the basis of radiation measurement by the first infrared radiation thermometer 11. Then, an emissivity characteristic peculiar to the wafer 10 when it undergoes deposition or after deposition and a conversion table showing a relation between an output voltage of the thermometer 11 and a temperature are obtained, and temperatures of the wafer 10 in a wafer temperature adjusting chamber 3 and a sputtering chamber 4 are measured with use of the above conversion table. Then, the wafer 10 is carried into a load lock chamber 23, and the load lock chamber 23 is evacuated. Then, the wafer 10 is carried into the wafer temperature adjusting chamber 3. In the wafer temperature adjusting chamber 3, the wafer 10 is heated by a lamp heater 25, and a temperature of the wafer 10 is measured by a second infrared radiation thermometer 14 and is controlled to 400° C. Then, the wafer 10 is carried into the sputtering chamber 4. In the sputtering chamber 4, sputtering is carried out in accordance with a temperature profile shown in FIG. 5 as to form a thin film on the wafer 10. A sputtering target 8 has a composition of 1% Si—3% Cu—Al.

A wafer temperature controller 13 determines which stage the wafer 10 subjected to temperature measurement on the calibration stage 5 is now carried to and placed on, and measures a temperature of the wafer 10 now placed on this stage with use of the thermometer output—temperature conversion table. Then, on the basis of the result of measurement on each stage, a temperature of the stage 6 is adjusted by the wafer temperature controller 13 to adjust the temperature of the wafer 10 to an arbitrary predetermined temperature.

In the sputtering chamber 4, a temperature of the wafer 10 is first controlled to 230° C., and a first sputtering is carried out to form an Al thin film having a thickness of about hundreds of angstroms. Then, the first sputtering is stopped once, and the wafer 10 is carried into the wafer temperature adjusting chamber 3. In the wafer temperature adjusting chamber 3, the temperature of the wafer 10 is heated to 300° C. by the lamp heater 25 to grow crystal grains in the Al thin film obtained by the first sputtering, thereby improving orientation or the like. Then, the wafer 10 is carried again into the sputtering chamber 4, and the temperature of the wafer 10 is set to about 400° C. At this temperature, a second sputtering is carried out to make the film thickness up to about 1 μm, thereby obtaining the Al thin film having large crystal grains and improved in orientation. Immediately after the second sputtering, the wafer 10 is carried into an unloading chamber 24, and the wafer 10 is quenched to about 50° C., thereby suppressing precipitation of Si and Cu in the Al thin film.

While there has been described an example that the Al thin film is to be formed on the upper surface of the wafer by sputtering, repeatability of crystallization in the thin film can be improved to thereby achieve a good quality of the thin film since temperature control of the wafer can be effected with a high accuracy through the stage. If the temperature of the wafer 10 in heating the thin film having the thickness of about hundreds of angstroms is set to 350° C. or higher, crystallization cannot be improved. Accordingly, if there does not exist the present invention enabling knowledge of an accurate temperature, the film forming method as mentioned above cannot be industrially achieved.

The vacuum processing device of the present invention is of course applicable to any film forming devices such as a CVD (Chemical Vapor Deposition) device other than the sputtering device mentioned above.

For instance, the present invention is effective in the case of forming a tungsten film on a silicon wafer as a substrate by a known CVD method.

In such a film forming device, a quality of a thin film to be formed is dependent upon an accuracy of temperature control of the wafer. Accordingly, the film forming device of the present invention can maintain a good quality of a thin film to be formed on a substrate.

Although the vacuum processing chamber in the vacuum processing device of the present invention is employed as the film forming chamber in the above preferred embodiment, the vacuum processing chamber may be employed as a dry etching chamber such as a plasma etching chamber. In this case, temperature control of a wafer to be etched may be easily realized in the same manner as that mentioned in the above embodiment.

There will now be described measurement of a wafer temperature upon sputtering and heating with use of a lamp in the case of employing the vacuum processing device mentioned in a second embodiment for sputtering.

Figure 6:
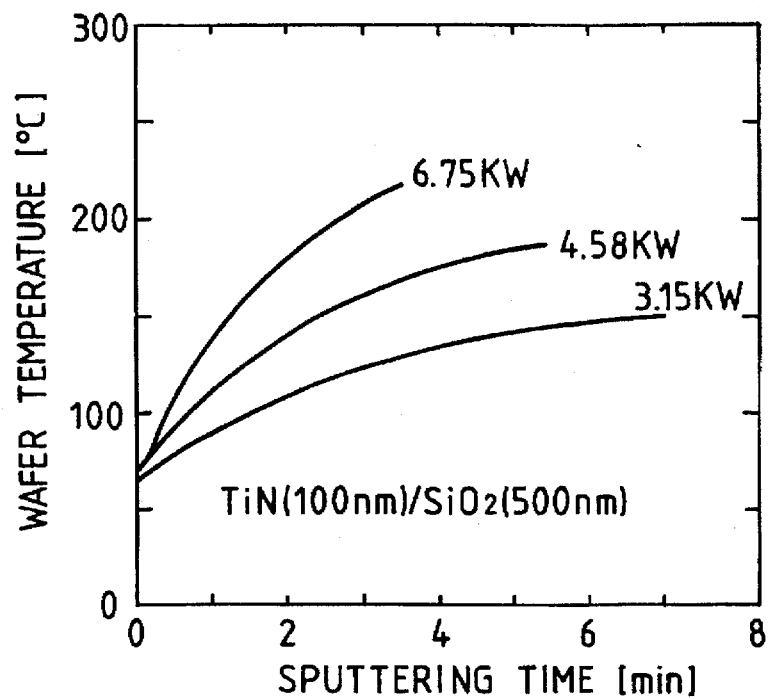
FIG. 6 is a graph showing a temperature increase characteristic during Al sputtering according to another embodiment of the present invention.

FIG. 6 shows a change in wafer temperature with an elapsed time in sputtering. It is apparent from FIG. 6 that the wafer temperature is dependent upon sputtering power.

Figure 7:
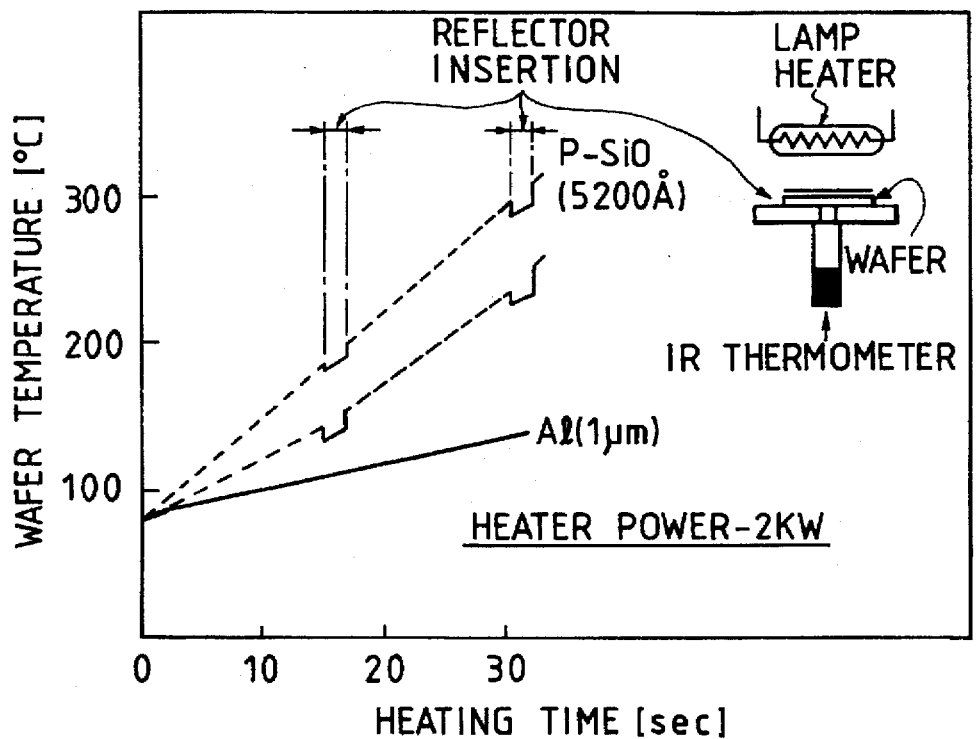
FIG. 7 is a graph showing temperature measurement of a wafer heated by a lamp heater.
Figure 8:
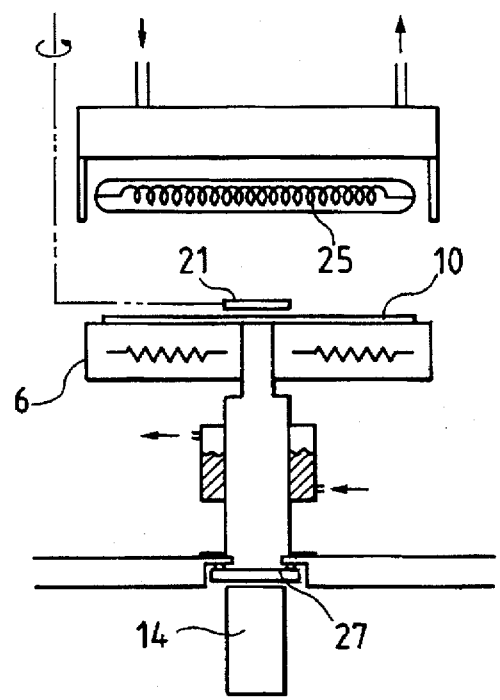
FIG. 8 is a sectional view of a lamp heating stage.

FIG. 7 shows an example that the wafer 10 is heated by the lamp heater 25 in the wafer temperature adjusting chamber 3. FIG. 8 shows an exemplary construction of the stage 6 upon heating of the wafer 10 by means of the lamp heater 25. As shown in FIG. 8, the lamp heater 25 is located over the wafer 10. Only upon temperature measurement of the wafer 10, the shutter 21 is located over the wafer 10 proximate thereto. The infrared radiation thermometer 14 is located under the stage 6. The mirror shutter 21 may have various constructions. For example, the mirror shutter 21 may be operably driven in synchronism with a timing of temperature measurement of the wafer 10, or the mirror shutter 21 may be fixed in a certain area of the chamber and the wafer 10 may be moved to a position under the shutter 21 at the temperature measurement timing. In FIG. 7, broken lines show wafer temperatures when the mirror shutter 21 is not located over the wafer 10 upon heating of the wafer 10 by the lamp heater 25, so that infrared radiation from the lamp heater 25 enters the infrared radiation thermometer 14 as stray light. Therefore, the wafer temperatures shown by the broken lines are not actual temperatures of the wafer 10. When the mirror shutter 21 is inserted between the wafer 10 and the lamp heater 25 upon temperature measurement, the stray light is removed as shown by solid lines in FIG. 7, causing a reduction in wafer temperatures measured. The wafer temperatures at this time are the actual temperatures of the wafer 10. Thus, in the case of using the lamp heater 25, the mirror shutter 21 has a function of removing stray light from the lamp heater 25 upon temperature measurement. During heating the wafer 10 by means of the lamp heater 25, the mirror shutter 21 is retracted from a position between the wafer 10 and the lamp heater 25, so as not to hinder the heating by the lamp heater 25.

Figure 9:
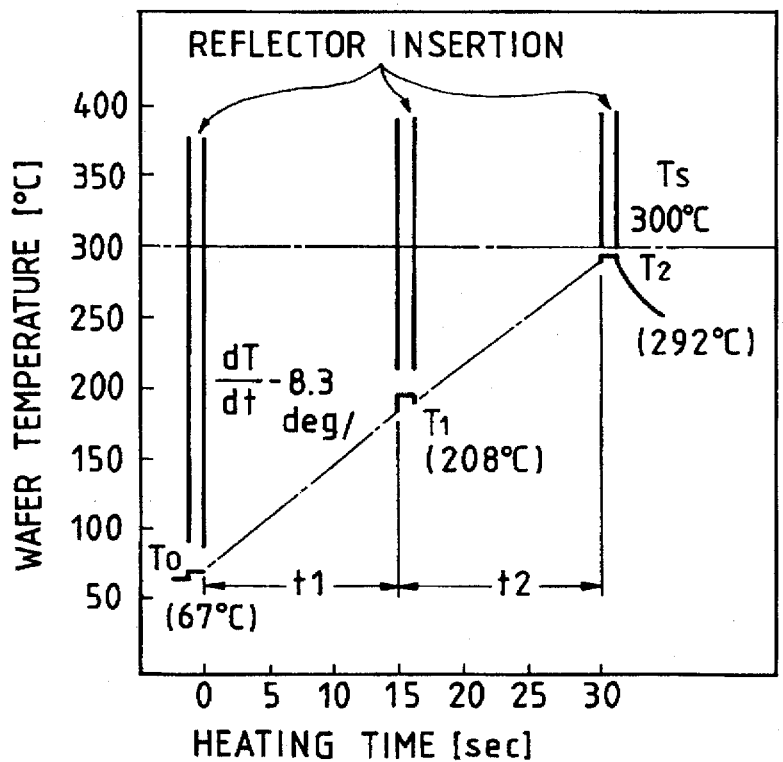
FIG. 9 is a graph showing a wafer temperature control method in heating the wafer by the lamp heater.
Figure 10:
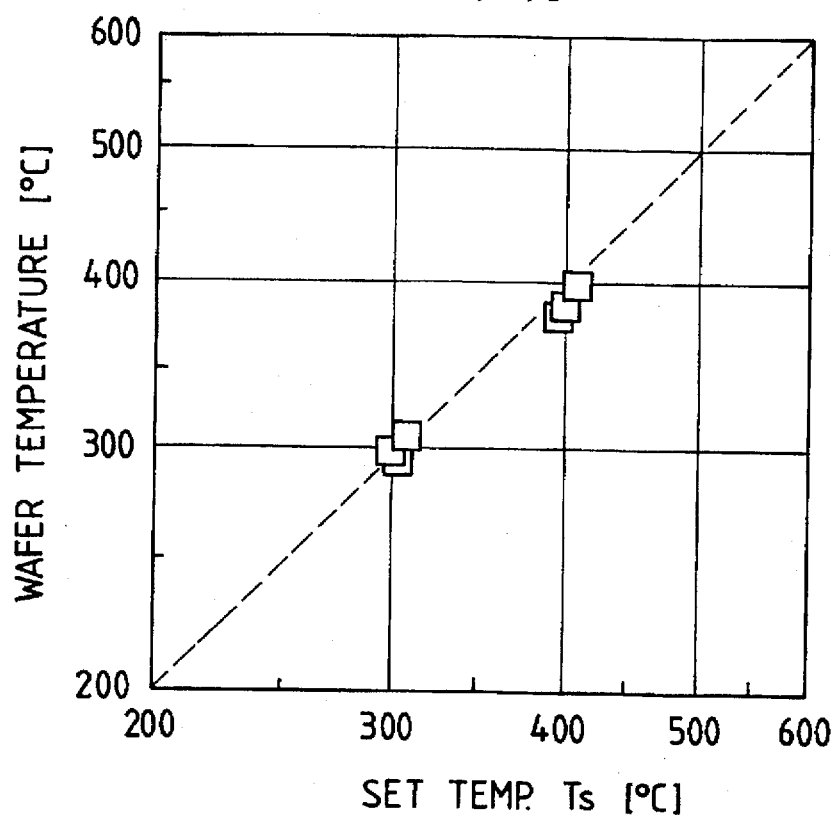
FIG. 10 is a graph showing a wafer temperature at the end of heating in relation to a heating set temperature.

FIGS. 9 and 10 show a wafer temperature control method during heating by the lamp heater 25. A wafer temperature $T_0$ before start of heating and a wafer temperature $T_1$ at a known elapsed time t from the start of heating are measured by the infrared radiation thermometer 14 to obtain a temperature increasing speed. Then, assuming that the temperature increasing speed is constant after the elapsed time $t_1$, a remaining heating time $t_2$ for heating the wafer 10 up to a desired heating temperature (set temperature; Ts) is decided. After end of heating, a wafer temperature $T_2$ is measured. As a result, as shown in FIG. 10, wafer temperatures can be controlled with an accuracy of ±2.5° C. for the set temperatures of 300° C. and 400° C.

There will now be described a correcting method to predict the emissivity when the corresponding wafer undergoes deposition, or after deposition, or when a mirror is placed in close proximity to the wafer, a preparing method for a thermometer output—temperature conversion table, and a measuring method for a wafer temperature, with reference to FIGS. 11 to 14 and Tables 1 to 5.

Figure 11:
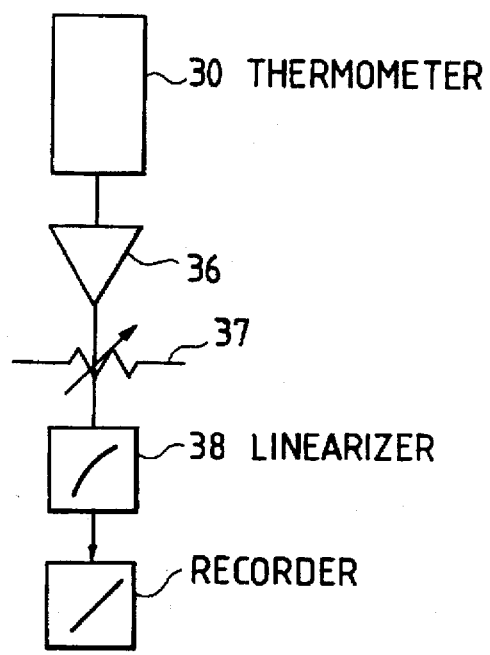
FIG. 11 is a schematic block diagram illustrating an infrared radiation thermometer in the prior art.

FIG. 11 shows a construction of an infrared radiation thermometer in the prior art. An output from an infrared radiation thermometer 30 is proportional to a radiation energy, and it has a nonlinear relationship to an actual temperature. Accordingly, it is necessary to provide a linearizer 38 for linearizing the output from the infrared radiation thermometer 30. Data for linearization by the linearizer 38 can be obtained by numerical calculation from a well-known expression of black body radiation. Table 1 shows a relation between an output signal voltage from the infrared radiation thermometer 30 and a measured temperature on the basis of the result of calculation.

TABLE 1

Relation between output signal intensity from infrared radiation thermometer and measured temperature (emissivity: 1.0)

| Black Body Temp. (°C.) | Output Signal Voltage (V) |
|---|---|
| . | . |
| . | . |
| . | . |
| 150 | 1.700 |
| 151 | 1.705 |
| 152 | 1.710 |
| 153 | 1.716 |
| 154 | 1.722 |
| 155 | 1.730 |
| . | . |
| . | . |
| . | . |

An amplifier 36 is provided prior to the linearizer 38. The amplifier 36 is provided with a gain adjusting function 37. The emissivity constitutes a measure representing easiness of radiation from a body in relation to temperature. For example, a gain of the amplifier 36 may be set to 1 for a body having an emissivity of 1, thereby enabling temperature measurement. Similarly, the gain of the amplifier 36 may be set to 2 for a body having an emissivity of 0.5, thereby enabling temperature measurement. Thus, a sensitivity of the infrared radiation thermometer as a whole is adjusted according to an emissivity before carrying out the linearization. In the case that an infrared radiation emissivity of some body changes with a change in temperature, the gain of the amplifier 36 shown in FIG. 11 must be changed in concert with a change in temperature. This case will be hereinafter described in detail.

Figure 12:
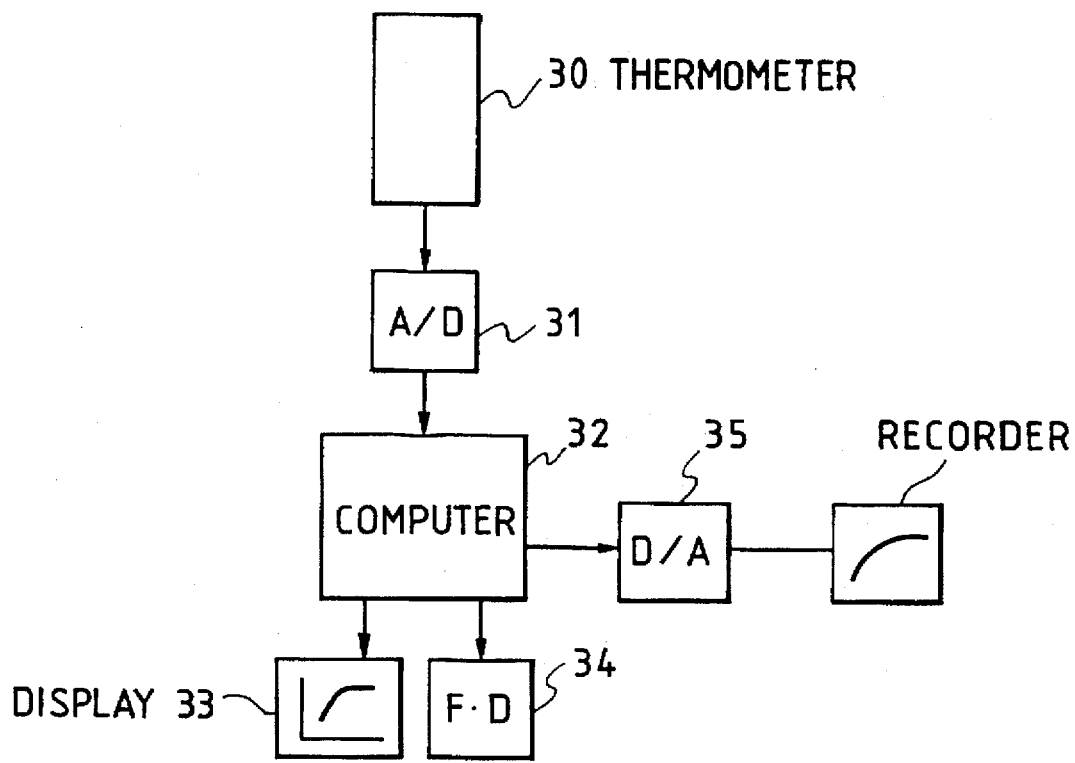
FIG. 12 is a schematic block diagram illustrating an infrared radiation thermometer according to a further embodiment of the present invention.

FIG. 12 shows an example wherein a computer is used for signal processing of the thermometer shown in FIG. 11, in which the linearization processing is carried out by digital computation. Referring to FIG. 12, an analog signal from the infrared radiation thermometer 30 is converted into a digital signal by an A/D converter 31, and the digital signal is input into a computer 32. The result of computation by the computer 32 is displayed by a display 33 or recorded by a floppy disk 34. Further, the digital output from the computer 32 is converted into an analog signal for a recorder by a D/A converter 35, and the analog signal is recorded by the recorder.

Figure 14:
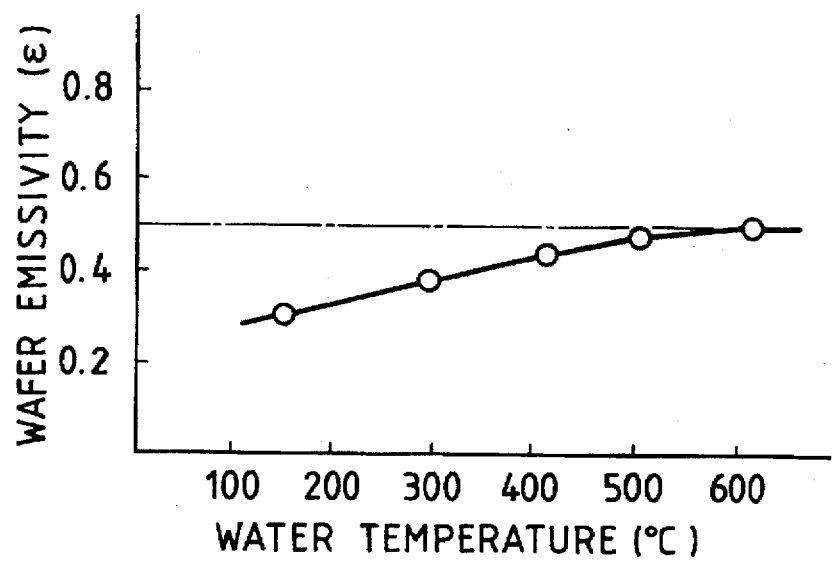
FIG. 14 is a graph showing a result of measurement of an emissivity of a wafer.
Figure 13:
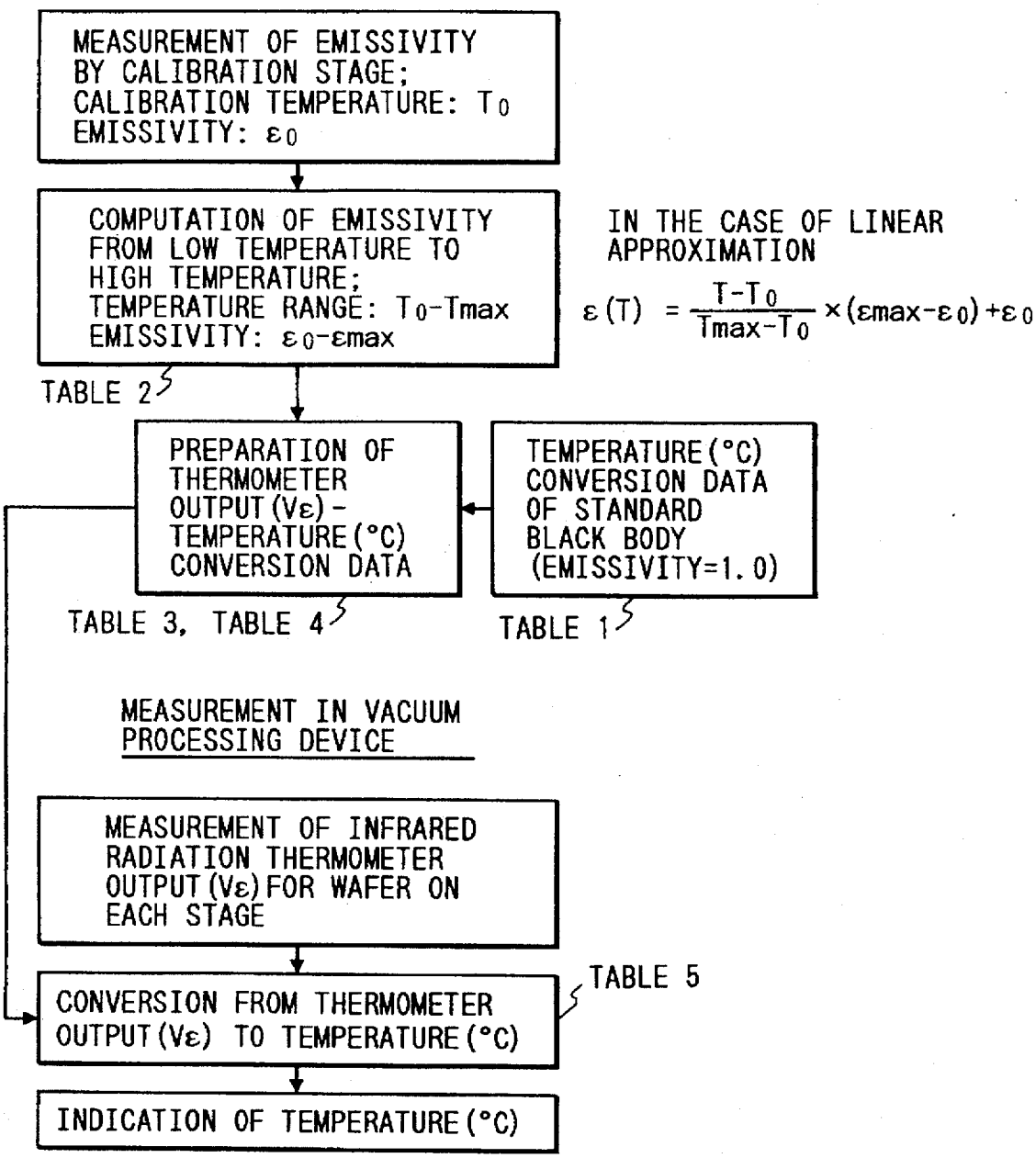
FIG. 13 is a flow chart illustrating measurement of an emissivity and preparation of a thermometer output—temperature conversion table.

The measurement of temperature will be described with reference to FIGS. 13 and 14. First, an emissivity of the wafer is measured at a known temperature by the calibration stage. In the case that the known temperature for measurement is $T_0$, for example, the emissivity is obtained as $\epsilon_0$. In the case that the wafer is a semiconductor wafer such as a Si wafer, it is known that at high temperatures of 500° C. or higher, the emissivity at a temperature of Tmax becomes constant, that is, the emissivity is converged to $\epsilon_{max}$.

The relation between a wafer temperature and an emissivity is obtained by the computer 32 so that the emissivity $\epsilon(T)$ is represented as a function of the wafer temperature T by linear interpolation. An example of this relation is shown in Table 2.

TABLE 2

Relation between wafer temperature and emissivity

| Wafer Temp. (°C.) | Emissivity |
|---|---|
| . | . |
| . | . |
| 150 | 0.300 |
| 151 | 0.310 |
| 152 | 0.310 |
| . | . |
| . | . |
| 599 | 0.499 |
| 600 | 0.500 |

Then, on the basis of the emissivity characteristic peculiar to the wafer, a thermometer output—temperature conversion table peculiar to the wafer is prepared by the computer 32. This conversion table is prepared as a linear conversion table by computing emissivities with a pitch of 0.01 from the theory of black body radiation. The emissivities are picked up at a pitch of 1.0° C. of the wafer temperature from Table 2, and the conversion table as shown in Table 5 is finally prepared. Temperatures of the wafer in the vacuum processing device 1 are occasionally measured with reference to this conversion table.

The computation for the preparation of the thermometer output—temperature conversion table shown in Table 5 will now be described with reference to Tables 2 to 5. In Table 2 to 5, the values are virtual data.

TABLE 3

Relation between thermometer output signal intensity and converted temperature (emissivity: 0.3)

| Output Signal Intensity (V) | Converted Temp. (°C) |
|---|---|
| . | . |
| . | . |
| 0.510 | 150 |
| 0.512 | 151 |
| 0.513 | 152 |
| 0.515 | 153 |
| 0.519 | 154 |
| . | . |
| . | . |

TABLE 4

Relation between thermometer output signal intensity and converted temperature (emissivity: 0.31)

| Output Signal Intensity (V) | Converted Temp. (°C) |
|---|---|
| . | . |
| . | . |
| 0.527 | 150 |
| 0.529 | 151 |
| 0.530 | 152 |
| 0.532 | 153 |
| 0.534 | 154 |
| . | . |
| . | . |

TABLE 5

Relation between thermometer output signal intensity and converted temperature

| Output Signal Intensity (V) | Converted Temp. (°C) |
|---|---|
| . | . |
| . | . |
| 0.510 | 150 |
| 0.530 | 152 |
| 0.532 | 153 |
| 0.534 | 154 |
| . | . |
| . | . |

First, a computing method for the emissivities will now be described. FIG. 14 shows a measured result of a change in emissivity of the wafer with a change in temperature of the wafer. In the case that the emissivity of the wafer is measured at 150° C. to obtain 0.3, linear interpolation is carried out between the emissivity of 0.3, at 150° C. and the emissivity of 0.5 at 600° C. (which is constant at 600° C. or higher) to obtain the emissivities as shown in Table 2. Then, from these emissivities and the relation between a black body temperature and a thermometer output, a relation between a thermometer output and a wafer temperature is computed. For example, in the case that the emissivity is 0.30, the relation between the thermometer output and the wafer temperature as shown in Table 3 can be obtained, while in the case that the emissivity is 0.31, the relation between the thermometer output and the wafer temperature as shown in Table 4 can be obtained. In comparison with Table 1, the thermometer output voltage for the wafer having the emissivity of 0.30, in Table 3 is simply 0.30, times that for the black body having the emissivity of 1.0 in Table 1 at the same wafer temperature. Similarly, the thermometer output voltage for the wafer temperature having the emissivity of 0.31, in Table 4 is simply 0.31, times that for the black body in Table 1 at the same wafer temperature. These results are natural from the definition of body radiation.

The processing to be executed in the computer will now be described.

It is determined from Table 2 that the emissivity of 0.3, is to be employed in the wafer temperature range between 150° and 151° C., for example. Then, it is determined from Table 3 that the thermometer output voltage corresponding to the temperature of 150° C. is 0.510 V. Further, at the wafer temperature of 152° C., it is determined from Table 2 that the emissivity is 0.310. Accordingly, it is determined from Table 4 that the thermometer output voltage corresponding to the temperature of 152° C. is 0.530 V. Such processing is executed in a wafer temperature range to be measured. Then, the relation between the thermometer output voltage and the wafer temperature in the intended temperature range is tabulated as shown in Table 5 which is merely illustrative.

The conversion between the thermometer output voltage and the wafer temperature in the intended temperature range to be measured is carried out with reference to the conversion table as shown in Table 5. Accordingly, even when the wafer is a semiconductor wafer having an emissivity largely changing with a change in temperature as shown in FIG. 14, it is only necessary to measure an emissivity at art environment temperature or one low temperature near the environment temperature, thereby effecting accurate measurement of emissivities over the intended wafer temperature range to be measured.

A method of measuring an emissivity of a Si wafer as the wafer will now be described with reference to FIG. 15, which shows an arrangement for measuring emissivity of a wafer 10. The wafer 10 is placed on a wafer temperature calibration stage 5. A specular reflector 40 is located over the wafer 10. The specular reflector 40 must have a sufficiently high reflectivity for an intended wavelength region to be measured. A beam splitter 41 is located under the wafer temperature calibration stage 5. A reference light generator 42 is provided to generate a reference outgoing light 43 having a wavelength of about 10 μm as a main component by using a suitable filter. The reference outgoing light 43 from the reference light generator 42 is transmitted through the beam splitter 41 to enter the wafer 10. A reflected light 44 from the wafer 10 is bent by the beam splitter 41 to enter a light detector 45. A radiated or transmitted light above the wafer 10 is reflected by the specular reflector 40, and the entire light is returned to the wafer 10.

In general, an emissivity is equal to an absorptivity α on the assumption that an incident light intensity $I_o$, a transmitted light intensity $I_t$ and a reflected light intensity $I_r$ are all known, and the emissivity is expressed as follows:

$$\alpha = (I_o - I_t - I_r)/I_o$$

Figure 15:
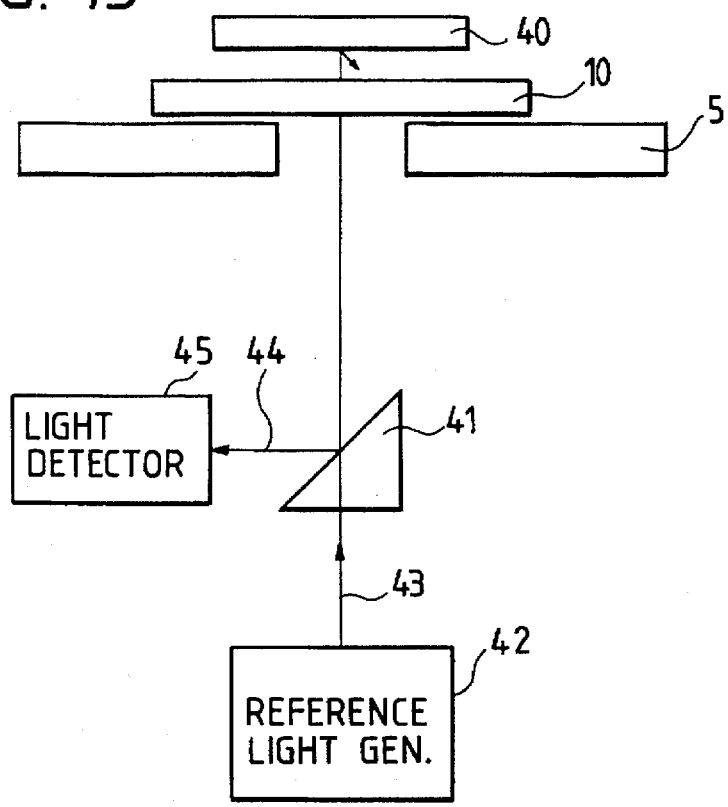
FIG. 15 is a schematic block diagram illustrating an emissivity measuring device enabling calibration of an emissivity of a wafer according to another embodiment of the present invention.

In the preferred embodiment shown in FIG. 15, the transmitted light intensity $I_t$ is zero because the specular reflector 40 is located over the wafer 10. Accordingly, the absorptivity or emissivity of the wafer 10 can be calculated by knowing the incident light intensity $I_o$ and the reflected light intensity $I_r$ to the wafer 10. In the case of applying the emissivity thus calculated to the wafer 10 when it undergoes deposition, or after deposition, or when a mirror is placed in the close proximity to the wafer before performing vapor deposition of a metal film, an infrared radiation thermometer is located under the wafer 10 to measure a temperature of the wafer 10, and the specular reflector 40 is located over the wafer 10. However, during or after performing the vapor deposition of the metal film, the specular reflector 40 becomes unnecessary because the metal film itself functions as the specular reflector 40.

Figure 16:
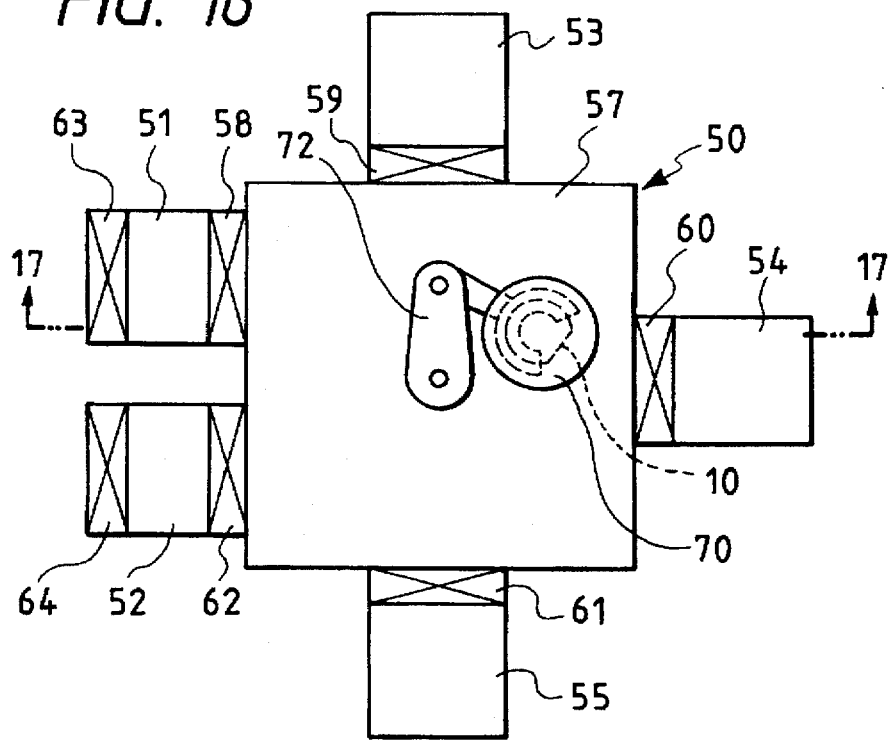
FIG. 16 is a plan view of a vacuum processing device of a multiple chamber type according to a further embodiment of the present invention.

Another embodiment of the present invention will now be described with reference to FIGS. 16 to 19, wherein FIG. 16 shows a schematic construction (plan view) of a sputtering device of the vacuum processing device of the present invention. In this preferred embodiment, a silicon (Si) wafer (which will be hereinafter referred to as a wafer) is employed as a substrate to be subjected to film formation, and an Al or Al alloy thin film (which will be hereinafter referred to as an Al thin film or Al film) is to be formed on the wafer by sputtering as a typical example. Referring to FIG. 16, reference numeral 50 generally designates a vacuum processing device having a six-chamber construction composed of a wafer loading chamber 51, a wafer unloading chamber 52, a vacuum baking chamber 53 as a first vacuum processing chamber, a sputter etching chamber 54 as a second vacuum processing chamber for removing a natural oxide film or the like present on a wafer surface, which will cause defective electrical Connection of wiring, before forming the Al film, a sputter film forming chamber 55 as a third vacuum processing chamber for forming the Al film, and a carrier chamber 57 having a carrier mechanism (e.g., an articulated carrier robot) for carrying a wafer 10 into each vacuum processing chamber and carrying back the wafer 10 from each vacuum processing chamber after each vacuum processing. The carrier chamber 57 is independently defined and connected to these chambers 51, 53, 54, 55 and 52 through gate valves 58, 59, 60, 61 and 62, respectively. Further, an evacuation system (not shown) is connected to each chamber, thereby maintaining a predetermined vacuum condition in each chamber. An infrared lamp heater (not shown) for heating the wafer 10 is provided in the vacuum baking chamber 53. Each of the sputter etching chamber 54 and the sputter film forming chamber 55 is provided with a gas introducing port (not shown) for introducing a predetermined gas into each chamber, so as to set an environment enabling generation of plasma by predetermined discharge. Further, each of the sputter etching chamber 54 and the sputter film forming chamber 55 is provided with a heater. While temperature measurement is not carried out during processing in these chambers 54 and 55, a heating condition of the heater is set in a constant condition. In the carrier chamber 57, temperature measurement of the wafer 10 is carried out before and after carrying the wafer 10 into and out of each of the chambers 53, 54 and 55. Further, each of the loading chamber 51 and the unloading chamber 52 is provided with a gas introducing mechanism (not shown) for introducing a gas (e.g., nitrogen gas or air) into each chamber, so as to restore an atmospheric pressure from a vacuum condition in each chamber for the purposes of loading and unloading of the wafer 10. Further, the loading chamber 51 and the unloading chamber 52 are provided with a loading door 63 and an unloading door 64, respectively.

Figure 17:
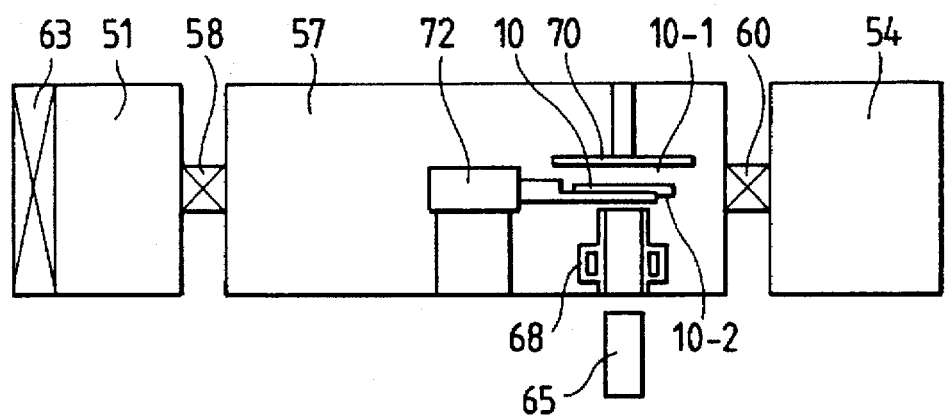
FIG. 17 is a cross section of the vacuum processing device taken along the line 17—17 in FIG. 16.
Figure 18:
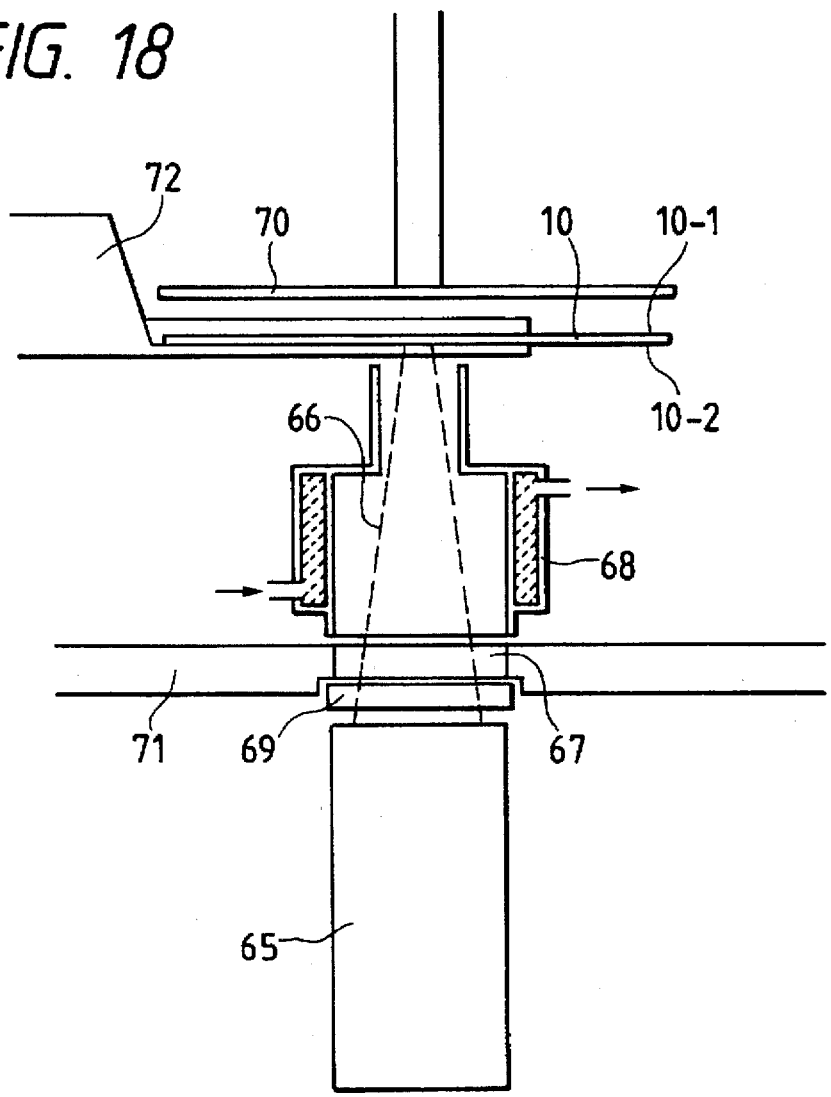
FIG. 18 is a sectional view of an optical system for measuring a wafer temperature, provided in a carrier chamber of the vacuum processing device shown in FIG. 16.

FIG. 17 is a cross section taken along the line 17—17 in FIG. 16 and shows that an infrared radiation thermometer 65 is located under the carrier chamber 57. The location of the infrared radiation thermometer 65 is a temperature measuring position, which is fixed with respect to the carrier chamber 57. FIG. 18 shows a detailed construction of an optical system located at the temperature measuring position, wherein an optical path 66 for temperature measurement is formed between the wafer 10 and the infrared radiation thermometer 65. A lower wall 71 of the carrier chamber 57 is formed with an observation window 67 for allowing the infrared radiation thermometer 65 to measure a temperature of the wafer 10. A cylinder 68 for shielding stray light is interposed between the wafer 10 and the observation window 67. The cylinder 68 is cooled with water so that it may not be heated to become a stray light generating source. In order to further reduce an adverse effect of the stray light, an inner wall of the cylinder 68 may be formed into a black body. The infrared radiation thermometer 65 is located in the atmospheric air.

Accordingly, the optical path 66 is obliged to pass the boundary between the atmospheric air and the vacuum at the observation window 67. A window plate 69 for forming this boundary is provided so as to cover the observation window 67. The window plate 69 is formed of a material capable of efficiently transmitting infrared radiation, such as barium fluoride, calcium fluoride, or ZnSe (zinc selenium). The window plate 69 has a thickness of normally about 5 mm to ensure a strength durable to the atmospheric pressure. Further, in order to prevent that the surrounding stray light causing a thermal noise which would enter the infrared radiation thermometer 65, a reflector 70 is located over the wafer 10 in the proximity of about 1 to 3 mm so that a specular reflecting surface of the reflector 70 is opposed to an upper surface 10-1 of the wafer 10. The reflector 70 has a size such that infrared radiation from the upper surface 10-1 of the wafer 10 may be reflected on the specular reflecting surface of the reflector 70 to sufficiently enter a region of the optical path 66. Further, the specular reflecting surface of the reflector 70 and the upper surface 10-1 of the wafer 10 are in close to each other to such a degree that the stray light may not enter as a detection noise into the infrared radiation thermometer 65. The reflector 70 may have any structure and be formed of any material provided that (1) it has a specular surface having a reflectivity to infrared radiation and (2) it has a function of shielding stray light.

Figure 19:
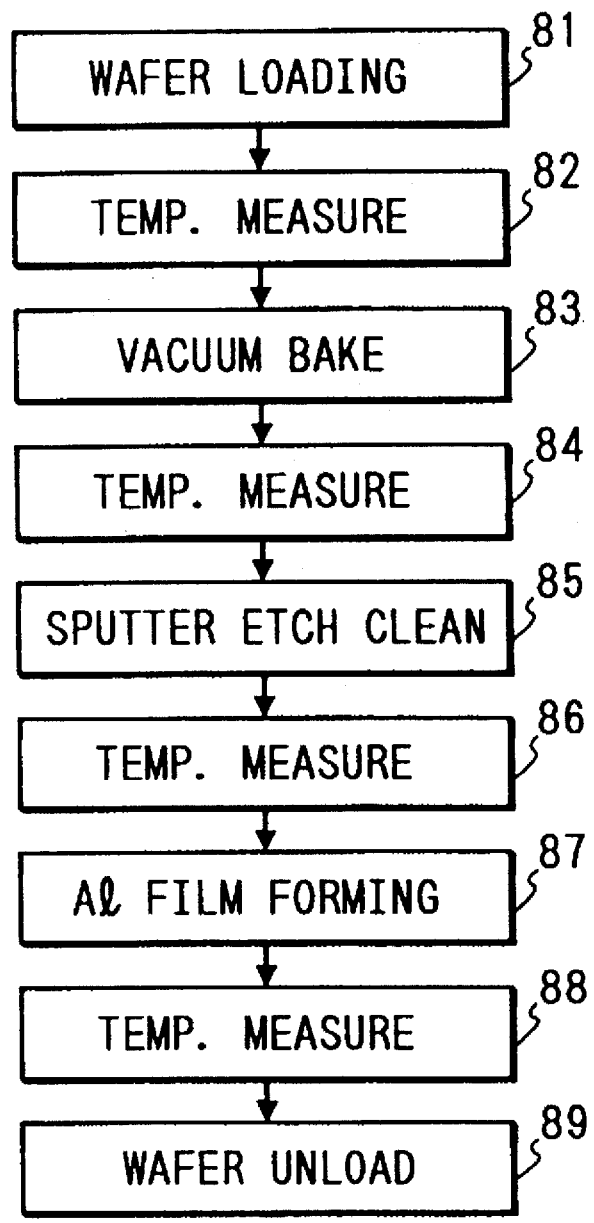
FIG. 19 is a flow chart illustrating a process flow of vacuum processing to be performed with use of the vacuum processing device shown in FIG. 16.

FIG. 19 shows an example of a process flow to be carried out in this embodiment, wherein in operation, the wafer 10 is first loaded into the loading chamber 51, then carried into the carrier chamber 57, and then carried into the vacuum baking chamber 53, in which the wafer 10 is baked in an evacuated condition. Thereafter, the wafer 10 is carried back into the carrier chamber 57, and then carried into the sputter etching chamber 54, in which the wafer 10 is subjected to cleaning such that a natural oxide film present on the surface of the wafer 10 is removed. Thereafter, the wafer 10 is carried back into the carrier chamber 57, and then carried into the sputter film forming chamber 55, in which an Al thin film is formed on the upper surface 10-1 of the wafer 10 by sputtering. Thereafter, the wafer 10 is carried back into the carrier chamber 57, then carried into the unloading chamber 52, and then unloaded to the atmospheric air. Thus, before and after carrying the wafer 10 into and out of each vacuum processing chamber, the wafer 10 is necessarily carried back into the carrier chamber 57, and a temperature of the wafer 10 is measured at the temperature measuring position mentioned above in the carrier chamber 57.

More specifically, the loading door 63 is first opened to load a single wafer or a plurality of wafers into the loading chamber 51 maintained in an atmospheric pressure (step 81). Then, the loading door 63 is closed, and the loading chamber 51 is evacuated down to a predetermined pressure. Then, the gate valve 58 is opened, and the first wafer is taken by a carrier robot 72 and is carried into the carrier chamber 57.

Then, a temperature of the wafer is measured at the temperature measuring position (step 82).

Apparent emissivities from the wafers are different from each other in dependence upon kinds of semiconductor products and structures and kinds of thin films formed in manufacturing steps previous to the sputter film forming step in this preferred embodiment. Accordingly, it is necessary to previously calibrate the emissivities of all the wafers to be subjected to temperature measurement by the infrared radiation thermometer. A perfect black body has an emissivity of 1, and a Si wafer has a relatively low apparent emissivity of 0.2 to 0.5. The Si wafer allows transmission of infrared radiation in a wide wavelength region. Accordingly, in the condition where the Al thin film has not yet been formed on the upper surface 10-1 of the wafer 10, infrared radiation incident upon the upper surface 10-1 and having been transmitted through the wafer 10 will enter as stray light into the infrared radiation thermometer to become a noise component. However, according to the present invention, the reflector 70 is located in the proximity to the upper surface 10-1 of the wafer 10, and the cylinder 68 is provided at the temperature measuring position. Therefore, no stray light enters the infrared radiation thermometer, thereby effecting stable radiation measurement without the noise component due to the stray light. Furthermore, infrared radiation radiating from the upper surface 10-1 of the wafer 10 is reflected on the specular surface of the reflector 70 to enter a lower surface 10-2 of the wafer 10.

Then, the wafer is carried into the vacuum baking chamber 53, and the wafer is baked in the vacuum baking chamber 53 in an evacuated condition (step 83). Then, the wafer is carried back into the carrier chamber 57, and a temperature of the wafer after baking is measured in the carrier chamber 57 in the same manner as the above (step 84). The temperature measured in step 84 becomes a temperature of the wafer before the subsequent sputter etching process. Then, the wafer is carried into the sputter etching chamber 54, and the wafer is sputter-etched in the sputter etching chamber 54 (step 85). Then, the wafer is carried back into the carrier chamber 57, and a temperature of the wafer after sputter-etched is measured in the same manner as the above (step 86). The temperature measured in step 86 becomes a temperature of the wafer before the subsequent Al sputter film forming process. The wafer is then carried into the sputter film forming chamber 55, and the Al film is formed on the wafer by sputtering (step 87). Then, the wafer is carried back into the carrier chamber 57, and the radiation from the wafer is measured. This time the wafer has a metal layer on the top surface, and the mirror is not necessary for the measurement (step 88). The emissivity has been predicted for this state of the wafer, and the temperature can be readily obtained from the temperature—radiation conversion table.

After the Al film is formed on the upper surface 10-1 of the Si wafer 10, infrared radiation having radiated from the upper surface 10-1 is reflected by the Al film to transmit through the wafer 10 and radiate from the lower surface 10-2. As a result, the infrared radiation of the reflected light from the Al film is added to original infrared radiation from the lower surface 10-2, thereby greatly increasing an apparent emissivity from the lower surface 10-2 of the wafer 10. Accordingly, in the conventional temperature measurement by an infrared radiation thermometer, an emissivity calibrated before the film formation process cannot be employed after the film formation process. However, according to the present invention, since the reflector 70 has a reflection characteristic equivalent to that of the Al film to be formed on the upper surface 10-1 of the wafer 10, the emissivity preliminarily calibrated can be employed in all the steps of the process flow shown in FIG. 19 irrespective of the presence or absence of the Al film on the upper surface 10-1 of the wafer 10. Thus, temperature measurement can be effected without the need of modification of the calibrated emissivity.

As mentioned above, the Al film functions as a very good reflector, that is, it has a very small emissivity (about 0.01–0.15). Thus, after the Al film is formed on the upper surface 10-1 of the wafer 10, an emissivity from the upper surface 10-1 becomes very small, so that infrared radiation from the upper surface 10-1 becomes insufficient for temperature measurement on the side of the upper surface 10-1. Accordingly, if the infrared radiation thermometer is located on the side of the upper surface 10-1 of the wafer 10, the emissivity calibrated before the film formation process cannot be employed after the film formation process because the emissivity from the upper surface 10-1 after forming the Al thin film becomes substantially smaller than that before forming the Al thin film. Furthermore, in this case, an apparent emissivity from the upper surface 10-1 changes irrespective of the use or nonuse of the reflector 70. Accordingly, temperature measurement on the side of the upper surface 10-1 to be subjected to the formation of the Al thin film becomes very difficult. However, according to the present invention, the infrared radiation thermometer is located on the side of the lower surface 10-2 of the wafer 10 to measure a temperature of the lower surface 10-2 of the wafer 10, and the reflector 70 is located on the side of the upper surface 10-1 of the wafer 10, thereby solving the above problems.

After the temperature measurement of the wafer on which the Al film has been formed, the wafer is carried into the unloading chamber 52, and a gas such as air or nitrogen gas is introduced into the unloading chamber 52 to bring an atmospheric pressure in the unloading chamber 52. Then, the unloading door 64 is opened, and the wafer is taken out of the unloading chamber 52 (step 89). For the next wafer, temperature measurement and vacuum processing are repeated in the same manner as the above.

It is to be noted that the process flow shown in FIG. 19 is merely illustrative and various modifications may be made according to the present invention. For example, in the case of forming a laminated wiring film structure, one or more film forming chambers may be added to the vacuum processing device 50, and temperature measurement and vacuum processing may be added to the process flow shown in FIG. 19.

Further, in the process flow, a cooling step for cooling the wafer to a predetermined temperature may be added after the vacuum baking step, the sputter etch cleaning step, and the sputter film forming step.

While the Al thin film is formed on the wafer by sputtering in the above preferred embodiment, a metal film may be formed on the wafer by tungsten—CVD, or a laminated multilayer structure of plural metal films may be formed on the wafer by sputtering in combination with tungsten—CVD.

Further, while the silicon wafer is employed as the substrate in the above preferred embodiment, the substrate may be formed of any material having a transparent or semitransparent characteristic to an infrared wavelength, such as a glass wafer mainly composed of silicon oxide or aluminum oxide, or a GaAs (gallium arsenide) wafer.

Additionally, while the measured temperature in the carrier chamber 57 is regarded as the wafer temperature before and after the vacuum processing in the above preferred embodiment, the measured temperature at the temperature measuring position in the carrier chamber 57 is strictly different from the wafer temperature at starting or ending of each vacuum processing because a radiation speed is varied with a speed of the carrier robot and an emissivity of the wafer itself. Accordingly, in a process required to take into consideration such a difference in temperature, the temperature measurement at the temperature measuring position in the carrier chamber may be continued for a given period of time to calculate a radiation speed, and the wafer temperature at starting or ending of each vacuum processing may be obtained by extrapolation from the radiation speed calculated above, thus effecting the temperature measurement with a higher accuracy.

Having thus described a typical example of formation of the Al thin film on the upper surface of the Si wafer in the above preferred embodiment, it is advantageous that the temperature measurement of the wafer can be performed with a high accuracy to thereby enable quick knowing of a change in wafer temperature causing a reduction in yield and finally obtain a high-quality thin film with a high yield.

Figure 20:
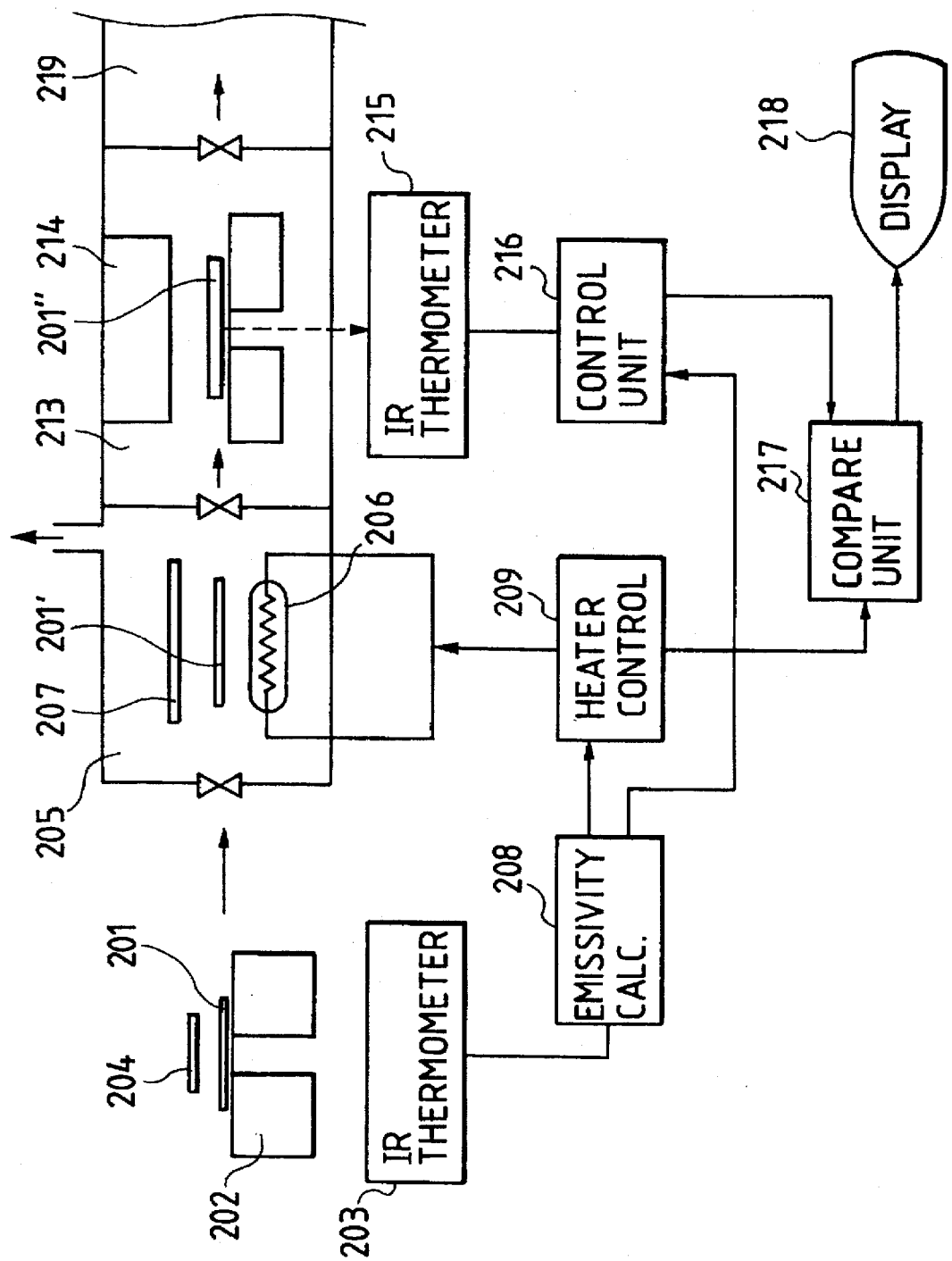
FIG. 20 shows a further embodiment according to the present invention, which is applied to a sputtering film forming device.

FIG. 20 shows a further embodiment according to the present invention. A vacuum processing device will be described by way of a sputtering device as an example.

A silicon wafer 201 as a substrate is first placed on a heating stage 202 having a large thermal capacity, and an emissivity is measured for calibration. In the heating stage 202, the wafer 201 is heated to a predetermined temperature, and radiation energy at that time is measured by an infrared radiation thermometer 203 to obtain an infrared emissivity as previously described. In experiments conducted by the inventors, the wafer was heated to 200° C. The wafer is kept in thermally good contact with the stage 202 by a vacuum chuck (not shown) and heated to an accurate temperature. In the measurement of radiation energy, a shutter in the form of a reflector 204 having a specular surface with respect to the infrared ray is set opposite to and parallel with the wafer in consideration that a silicon wafer is substantially transparent in a wide region of the infrared ray, and the measurement of radiation energy is carried out by the first infrared radiation thermometer 203 installed on the rear surface side of the wafer 201.

In the present embodiment, the measurement of radiation energy by the first infrared thermometer was carried out in the state of an inert atmosphere (for example Ar gas atmosphere). While in the present embodiment, the set temperature was 200° C., it is to be noted that elimination of the step of heating processing subjected to the wafer other than the heating processing necessary for process is advantageous in view of elimination of variation factors of product characteristics. Accordingly, the measurement of radiation energy can be also made by controlling the wafer to an environment temperature, for example a room temperature.

Subsequently, the wafer is introduced into a vacuum unit by suitable carriage arrangement (not shown) and subjected to lamp heating within the first vacuum unit 205. The first vacuum unit 205 is vacuum-exhausted by suitable evacuation means. The vacuum unit 205 will be further described. A heating lamp heater 206 is installed on the rear surface of a wafer 201', and a mirror shutter in the form of a reflector 207 having a specular surface similar to that used at the time of calibration is disposed with respect to the surface of the wafer 201'. In this case, however, the mirror shutter 207 must have a size sufficient to cover the entire wafer in order to obtain a good heating distribution. The heating by the lamp heater 206 is carried out under the conditions substantially similar to that when the emissivity is measured as described above.

Figure 21:
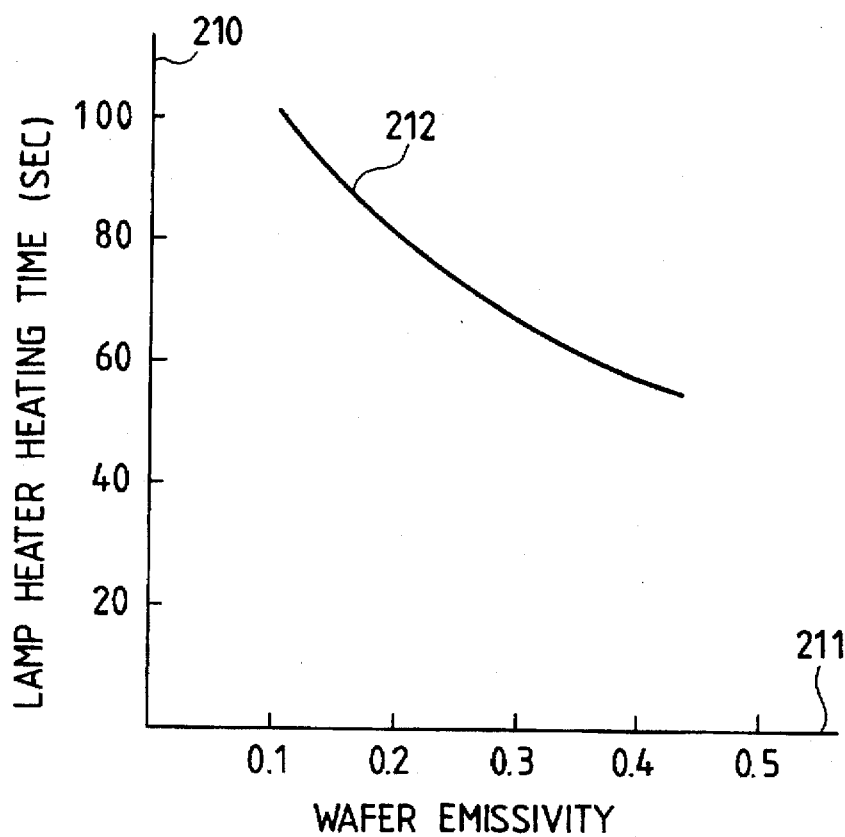
FIG. 21 is a graph showing the relationship between emissivity of a wafer and heating time by a lamp heater.

The control of the lamp heater will now be described. An output of the first thermometer 203 is supplied to an emissivity calculation circuit 208. The emissivity outputted from the circuit 208 is supplied to a lamp heater control power source 209. In FIG. 21, the ordinate 210 indicates a heating time when a power applied to the lamp heater 206 is 2 kilowatt, and the abscissa 211 indicates an emissivity of a wafer determined by the aforementioned method. In the lamp heater control power source 209, upon reception of the emissivity, there is determined a heating time required to reach a set temperature in the case where a power applied to the lamp heater is constant in accordance with the relationship of a curve 212 shown in FIG. 21. That is, in the case where the wafer has a high emissivity, heating is carried out in a shorter period of time. In an experiment conducted by the inventors, a heating lamp was used in which a target heating temperature is set at 350° C. and a power applied to the lamp is 2 kilowatt, and heating was carried out for one minute, after which the heating power source is cutoff. While in the aforementioned embodiment, the heating time has been a control parameter, it is to be noted that the temperature of the wafer heated by the lamp heater can be controlled even by controlling a heating power with the heating time set to be constant or by controlling both the heating time and power.

The curve 212 shown in FIG. 21 indicates that values are varied even by an optical system, a thermometer and the like for measuring emissivity, and the power necessary for heating also greatly varies in value due to a geometrical relation of a heater. Further, the radiation wavelength characteristic from the lamp also changes due to the power applied to the lamp heater, and a change of absorption characteristics caused by the wafer occurs. Therefore, it is necessary to experimentally determine the characteristics shown in FIG. 21.

In the configuration of the equipment shown in FIG. 20, wafers can be continuously precessed. For example, when the emissivity of a second wafer is measured, the first wafer is being subjected to lamp heating in the first vacuum unit. Accordingly, information obtained at the time of calibration is once stored and then sequentially used for individual wafers. The function block having a function for handling the order of wafers as described is not particularly shown. A wafer for which film forming processing has been terminated is carried out to atmosphere from a up loading vacuum unit which is a third vacuum unit 219.

The wafer heated to a predetermined temperature (350° C. in this embodiment) as described above is guided to a second vacuum unit 213 for sputter film deposition by a suitable carriage unit (not shown). In the second vacuum unit 213, an aluminum film is formed on a wafer 201" by a sputter electrode 214. In this vacuum unit 213 a second thermometer 215 is installed on the rear surface side of the wafer 201". When film deposition starts, an aluminum film is formed on the surface of the wafer. Because of this, the infrared radiation characteristic changes from that before starting of film deposition. A mirror in the form of a reflector 204 having a specular surface to imitate the deposited aluminum metal film at the time of calibration was used to obtain a value of emissivity in which the change of the radiation characteristic is predicted. Accordingly, when film deposition starts, an equivalent reflector is provided by the deposited aluminum metal film, and proper temperature measurement can be made by the second thermometer 215 installed on the rear surface of the wafer 201". More specifically, the emissivity predicted at the time of the calibration with an aid of the mirror body may be a value of emissivity of the wafer when it undergoes deposition, or after deposition, or when a mirror is placed in close proximity to the wafer for the second thermometer 215 or following thermometers. Upon receipt of output from the first thermometer, a radiation arithmetic circuit 208 outputs an emissivity for the corresponding wafer when it undergoes deposition, or after deposition, or when a mirror is placed in close proximity to the wafer. This output is supplied to a control unit 216 of the second thermometer 215 to automatically set the emissivity. Also in this case, time when the emissivity is measured is deviated from time when temperature is measured using the emissivity, and therefore, the control unit 216 functions for sequentially using the emissivity.

In FIG. 20, a comparison unit 217 compares a target heating temperature set to the control power source 209 of the lamp heater 206 with a wafer temperature determined by the second thermometer 215 and the control unit 216 to compare whether or not the relationship therebetween is in a rational range. More specifically, the wafer is heated by the lamp heater 206 and supplied to the second vacuum unit 213 for sputter film deposition. During that period, the temperature of the wafer is lowered by radiation cooling while it is present in a vacuum environment. The rate of the cooling is slow as compared with the carriage time of the wafer, and film forming starts from the time required for carriage of the wafer. That is, a temperature at the time at which measurement starts can be expected by the second thermometer 215.

Figure 22:
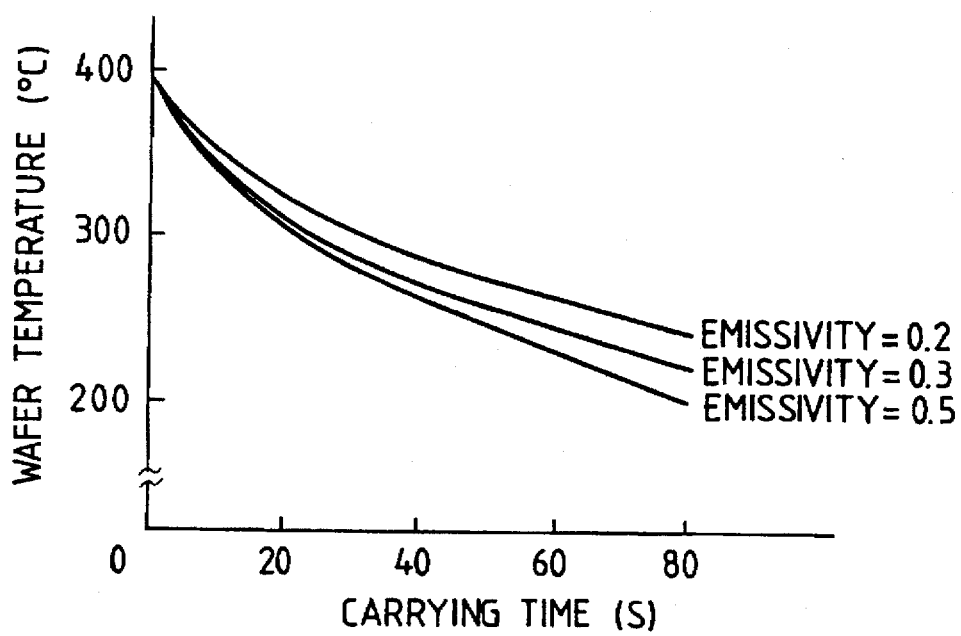
FIG. 22 is a graph showing a cooling curve of wafers.

FIG. 22 shows a cooling curve experimentally obtained. Since the cooling is naturally affected by the emissivity of the wafer, cooling curves were obtained for wafers having different emissivities. However, the emissivity used here was measured from the rear surface of the wafer, and the cooling from the surface of the wafer is not taken into consideration. Further, the cooling curve is largely influenced also by the ambient environmental temperature. It is therefore necessary to experimentally determine the relationship shown in FIG. 22.

The comparison mechanism 217 has data as shown in FIG. 22 stored therein and estimates a temperature at which measurement starts by the second thermometer 215 from an emissivity from the emissivity arithmetic circuit 208, a target heating temperature set to the control power source 209 and a time required for carriage of the wafer and compares the temperature with a temperature actually obtained by the second thermometer 215. If these temperatures are in a rational range of error, it is considered that heating operation was properly carried out. Conversely, in the case where these temperatures depart from a rational range of error, a disorder of thermometers, a disorder of the lamp heater or an abnormality such as a stain of the observation window resulting from entry of aluminum grains as a film forming material into portions other than the desired portion possibly occur, and therefore, a warning is given by a display device 218 so as to call an operator's attention thereto.

Figure 23:
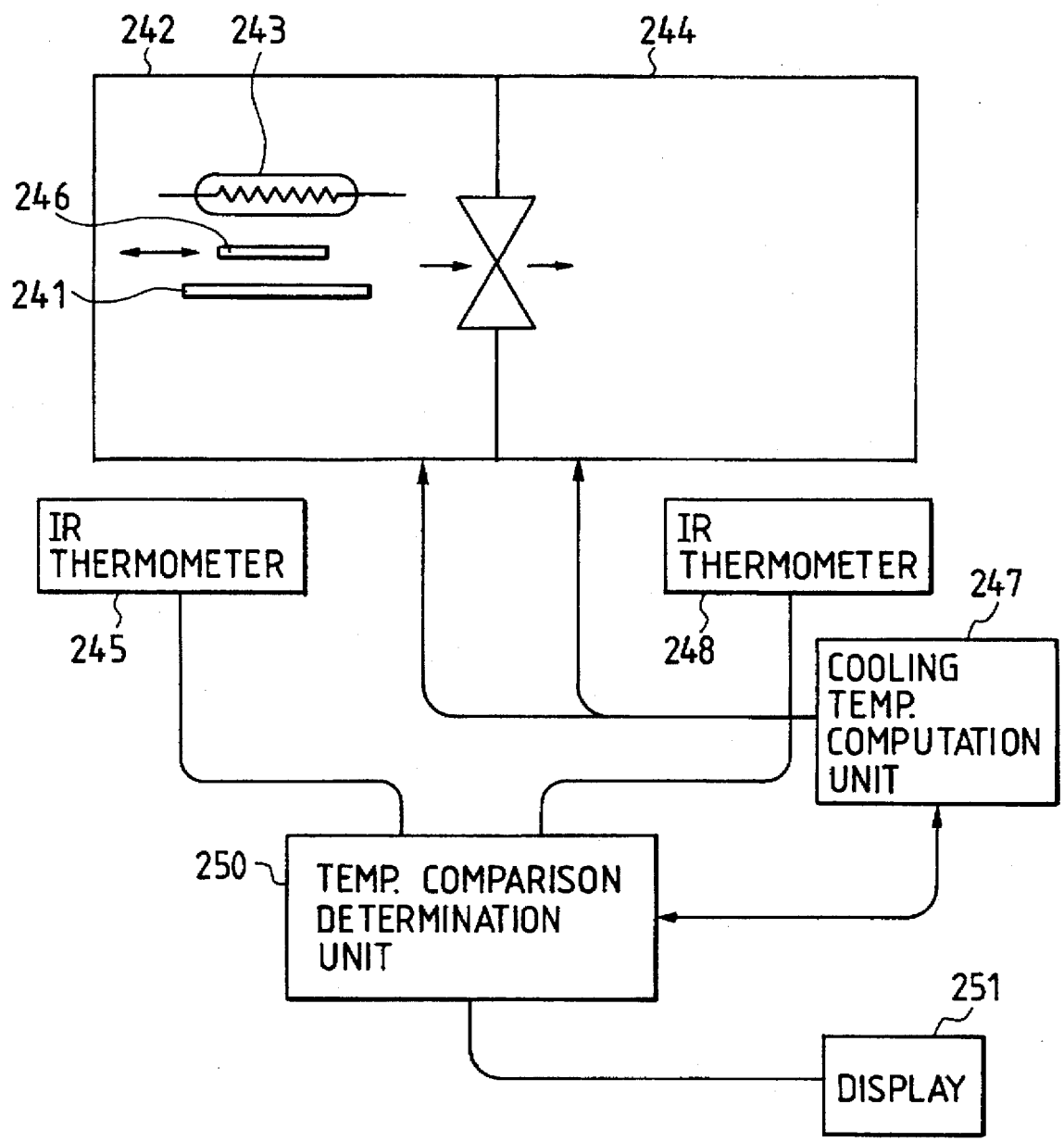
FIG. 23 shows an embodiment of the present invention in the case where two vacuum units are provided.

FIG. 23 shows another embodiment of the present invention, in which two vacuum units adjacent to each other are provided with infrared radiation thermometers, respectively. A silicon wafer 241 is heated by a lamp heater 243 in a first vacuum unit 242 and introduced into a second vacuum unit 244 by a suitable carriage unit (not shown). The wafer 241, before being carried from the first vacuum unit 242 is measured in temperature by an infrared radiation thermometer 245 and a movable shutter such as specular surface reflector 246 provided in the first vacuum unit 242. Only at the time of measuring a temperature, the specular surface reflector 246 is positioned with respect to the surface side of the wafer 241, and at the time other than the above, it can be withdrawn to a location not impairing heating by the lamp heater.

Figure 24:
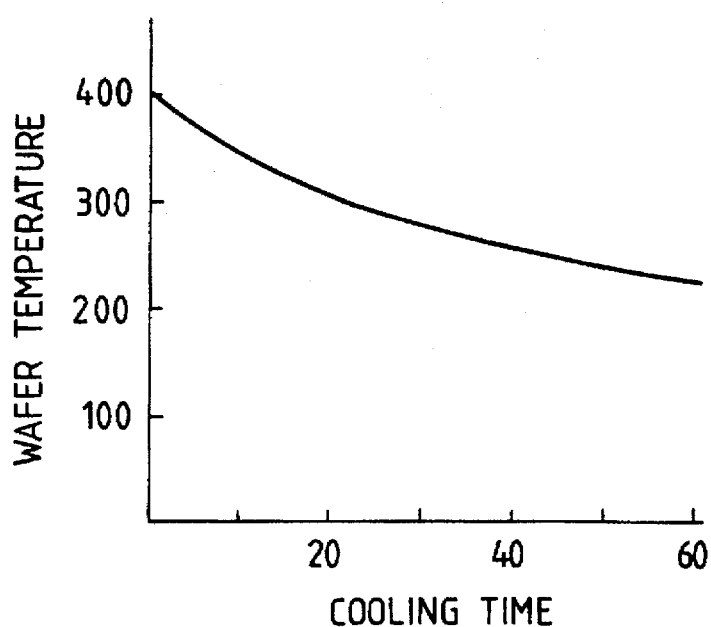
FIG. 24 is a graph showing cooling curve of silicon wafers.

A time t required for the wafer 241 to be carried from the first vacuum unit 242 to the second vacuum unit 244 is substantially predetermined, and data as shown in FIG. 24 indicating the wafer temperature and a drop in temperature of the wafer by cooling during carriage time are experimentally prepared in advance so that a temperature when the wafer is introduced into the second vacuum unit 244 can be calculated. An output of the infrared radiation thermometer 245 in FIG. 23 is applied to a cooling temperature computation unit 247. Since sputter film forming is carried out in the second vacuum unit 247, a temperature observing window material in this vacuum unit 244, a temperature observing window material in this vacuum unit possibly becomes stained as mentioned above. The wafer 241 arrives at the second vacuum unit 244 and is immediately subjected to sputter film deposition. In this embodiment, an aluminum film was deposited. The film deposited starts and a temperature at that time is measured by an infrared thermometer 248 arranged so that observation is carried out from the rear surface.

The time t required from arrival of the wafer 241 at the second vacuum unit 244 to subjection to film forming is supplied to the cooling temperature computation unit 247 to calculate a temperature drop portion $\Delta T$ caused by cooling using a data base as shown in FIG. 24. The $\Delta T$ from the cooling temperature computation unit 247 and an output of a thermometer 248 provided on the second vacuum unit 244 are applied to a temperature comparison determination unit 250. In the temperature comparison determination unit 250, if both numerical values are in a predetermined range of allowance, the operation of both thermometers is judged to be normal. If these values are not in the range, information of the effect that an abnormality occurs in either thermometer is displayed on a display unit 251 to inform a user of the equipment of such possibility as an abnormality of the thermometers. It is possible to easily stop mounting processing wafers by the present vacuum processing equipment in accordance with such information. The information is outputted to the outside, i.e., a host control equipment (not shown) of the present vacuum processing equipment. The control equipment can use the information to stop processing wafers and diagnose possible abnormalities of the present vacuum processing device.

Figure 25:
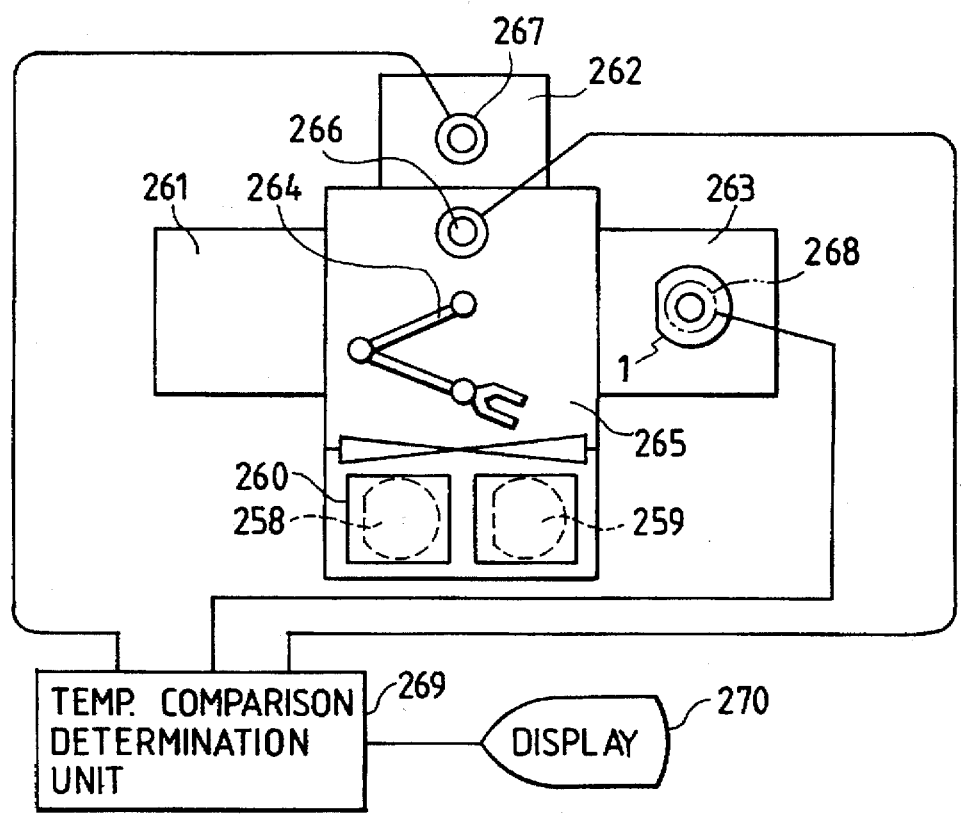
FIG. 25 shows an embodiment of the present invention which is applied to a device having a plurality of vacuum processing units having a carriage mechanism provided in a central portion thereof.

FIG. 25 shows another embodiment according to the present invention, in which a plurality of vacuum units 261 to 263 for carrying out vacuum processing are provided, and these vacuum units 261 to 263 are provided with vacuum carriage chambers 265 in which a central portion is provided with a handling robot mechanism 264 for carrying a wafer, the vacuum units being connected. The vacuum carriage chamber 265 is provided with a thermometer 266. The vacuum processing chamber 261 serves to carry out sputter etching processing and is not provided with a thermometer. The vacuum processing chambers 262 and 263 are sputter film deposited chambers, which are provided with infrared radiation thermometers 267 and 268. In the FIG. 25 an embodiment, a wafer is first subjected to sputter etching in the vacuum unit 261, and the wafer subjected to TiW sputter film deposition by the vacuum unit 262 is then subjected to aluminum sputter film deposition in the vacuum unit 263. The wafer is carried from one vacuum unit to the succeeding vacuum unit by the handling robot mechanism 264. At this time, the wafer is carried to a place where the thermometer 266 provided in the vacuum carriage chamber. The temperature is again measured in each of the vacuum units. The temperature of the wafer is calculated from the time required for the carriage (precisely, the time required to start film deposition in the vacuum unit) and the temperature measured by the thermometer 266, and the temperatures measured in the vacuum units 262 and 263 are transmitted to a temperature comparison determination mechanism 269 to judge the normal operation of the thermometers. This judgement is displayed on a display unit 270, and if an abnormality is present, a user of the device is informed thereof.

Figure 26:
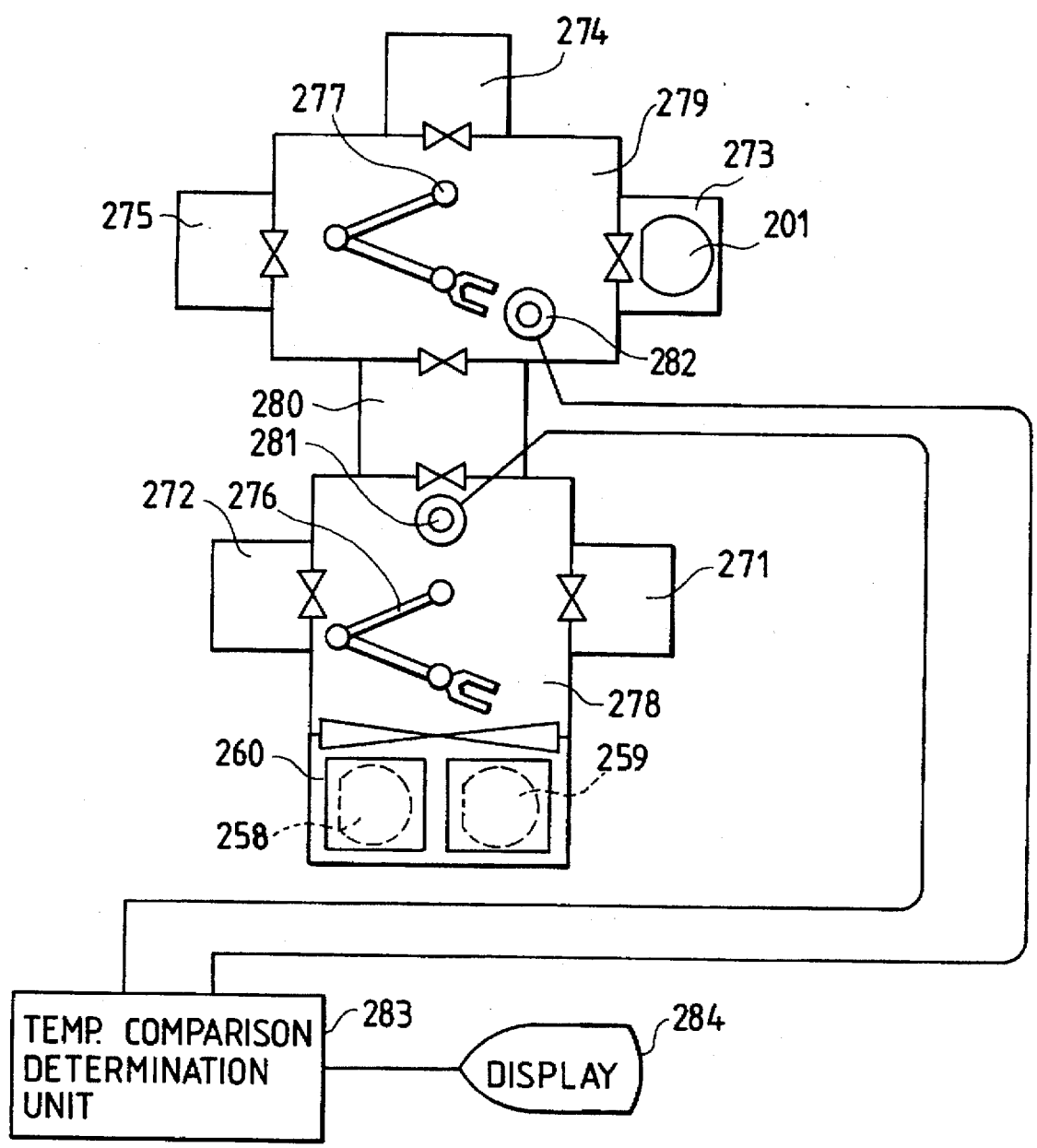
FIG. 26 shows an embodiment of a device provided with two carriage chambers according to the present invention.

FIG. 26 shows another embodiment according to the present invention. In this embodiment, a plurality of vacuum units 271 to 275 are provided. In these vacuum units 271 to 272 and vacuum units 273 to 275, vacuum carriage chambers 278 and 279 are present in which central portions are provided with handling robot mechanisms 276 and 277 for carrying a silicon wafer 210, and the carriage chambers are connected to the vacuum units. The carriage chambers 278 and 279 are connected to each other by a vacuum unit 280, and the wafer 201 can be freely moved to and from the carriage chambers 278 and 279 through the vacuum unit 280 by the handling robot mechanisms 276 and 277. The vacuum processing chamber 271 serves to carry out lamp heating process, the vacuum processing chamber 272 serves to carry out sputter etching processing, and the vacuum processing chambers 273 to 275 are sputter film deposition chambers. In the present embodiment, the vacuum carriage chambers 278 and 279 are provided with thermometers 281 and 282, respectively, and the vacuum processing chambers 271 to 275 are not provided with thermometers.

In the FIG. 26 embodiment, the wafer 201 is first subjected to vacuum baking in the vacuum processing chamber 271 and subjected to sputter etching in the vacuum unit 272. The wafer 201 after being subjected to TiW sputter film deposition in the vacuum unit 273 is then subjected to aluminum sputter film forming in the vacuum unit 274 and thence subjected to TiW sputter film forming in the vacuum unit 275.

The wafer 201 is carried from one vacuum processing unit to the succeeding vacuum processing unit by the handling robot mechanisms 276 and 277. At this time, the wafer 201 is carried to a place (a temperature measuring position) where the thermometers 281 to 282 provided in the respective vacuum carriage chambers are installed to measure a temperature. A wafer temperature at the time of each vacuum processing is calculated from the time required for the carriage (precisely, the time required for subjection to vacuum processing such as lamp heating, film deposition, etc. in the vacuum units or required for movement of the wafer from the termination of these vacuum processings to measuring positions of the thermometers 281 and 282 and the temperatures measured by the thermometers 281 to 282 in consideration of cooling data of wafer temperatures as shown in FIG. 24 from a cooling temperature computation unit (not shown). At this time, the wafer temperatures obtained by the thermometers 281 and 282 of the carriage chambers 278 and 279 are transmitted to a comparison determination unit 283 for comparison thereof, and the normal operation of the thermometers is judged in consideration of the carriage time between two temperature measuring positions within the vacuum carriage chambers. This judgement is displayed on a display unit 284, and if an abnormality is present, a user of the device is informed thereof.

While in the above-described embodiment, no thermometer is installed in the vacuum processing chambers themselves, it is to be noted that thermometers are installed on vacuum processing chambers themselves as in the embodiment shown in FIG. 25 and the embodiments shown in FIGS. 25 and 26 may be combined.

According to the present invention, accurate temperature measurement and temperature control of a substrate in vacuum can be effected to realize a vacuum processing device which can accurately control a temperature of the substrate. In the case of applying the present invention to a film forming device, accurate temperature control of the substrate necessary before and after forming a film and during deposition the film on the substrate can be easily effected to realize formation of the film with a high quality. Further, according to the present invention, particularly in a vacuum processing device of a multiple chamber type, accurate temperature control of a substrate can be effected, and formation of a high-quality thin film can be continuously controlled to greatly reduce a final fraction of defective products.

As is apparent advantageous effects obtained by the present invention include stability and improvement of quality in order that a substrate can be heated in a stable manner. As a further great effect, an improvement in productivity can be mentioned. This will be described hereinbelow.

In the case where a lamp heater is not at all controlled, in order to make a temperature at the time of starting film deposition constant, wafers are cooled for a sufficient period of time, after being heated in a first vacuum unit, until a predetermined temperature is obtained. That is, it is necessary to sufficiently heat all wafers to remove moisture therefrom, but heating temperatures maybe different according to the individual wafers as previously mentioned. If natural cooling is carried out for a long period of time, temperatures of all the wafers after being cooled gradually come close thereto, and the temperatures can be made constant. Of course, there was a drawback in that the productivity is impaired due to fan occurrence of the waiting time.

Temperatures of wafers introduced into a second vacuum unit are different from one another, and it is necessary to provide a waiting time until a certain temperature is obtained in order to make the temperatures constant. Even if the temperatures of wafers should be measured accurately to some extent before film deposition, it is essentially difficult to improve this point merely by the temperature measurement in the second vacuum unit for carrying out sputtering.

In the device according to the present invention, the temperature of a wafer at the time of being introduced into the second vacuum unit is constant, and the waiting time as described above need not be set and the productivity will not be impaired.

Further, even in the case where the film forming temperature should be a temperature higher than a level to some extent, film deposition is carried out immediately after heating, and extra heating need not be carried out according to the present invention. In the conventional device, the step of cooling is provided, and it is necessary to heat a wafer at an extremely high temperature at once. Since the controllability is not present in this heating action, the substrate itself may possibly be damaged. Therefore, the conventional device sometimes fails to respond to a demand in terms of quality such that a film forming starting temperature cannot be set to a high level.

As described above, the controllability of the substrate temperature according to the present invention such as the improvement in productivity, the improvement in quality of products, etc. has obvious effects.

By always confirming the normal operation of the thermometers for measuring the temperature of the substrate in vacuum, the capability for early finding an abnormality of indications of thermometers is provided, thereby considerably improving the operating reliability of the vacuum processing device. Thereby, there is substantially no case where a large volume of defective products are manufactured without becoming aware of an occurrence of deviation in temperatures.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

What is claimed is:

1. A vacuum processing device for a substrate comprising:

a plurality of vacuum units, at least one of the plurality of vacuum units enabling processing of the substrate therein;

means for carrying the substrate to the vacuum units;

a plurality of infrared radiation thermometers, each of the infrared radiation thermometers being provided for measuring a temperature of the substrate and for providing an output indicative thereof, at least one of the plurality of infrared radiation thermometers being disposed at a position with respect to the at least one of the plurality of vacuum units enabling processing of the substrate for measuring a temperature of the substrate during processing of the substrate and for providing an output indicative thereof, and at least one other of the plurality of infrared radiation thermometers being disposed at a different position from the position of the at least one of the infrared radiation thermometer for measuring a temperature of the substrate at the different position at least one of before and after processing of the substrate in the at least one of the plurality of vacuum units enabling processing of the substrate and for providing an output indicative thereof; and determination means for comparing the output provided by the at least one of the plurality of infrared radiation thermometers for measuring the temperature of the substrate during the processing of the substrate in the at least one of the plurality of vacuum units enabling processing of the substrate with the output provided by the at least one other of the plurality of infrared radiation thermometers for measuring the temperature of the substrate at the different position at least one before and after the processing of the substrate in the at least one of the plurality of vacuum units enabling processing of the substrate.

2. A vacuum processing device according to claim 1, further comprising means for providing an indication of the result of comparison by the determination means.

3. A vacuum processing device according to claim 1, wherein the at least one of the plurality of infrared thermometers is disposed in the at least one of the plurality of vacuum units enabling processing of the substrate.

4. A vacuum processing device according to claim 1, wherein the at least one other of the plurality of infrared radiation thermometers is disposed at the different position for measuring a temperature of the substrate both before and after processing of the substrate in the at least one of the plurality of vacuum units enabling processing of the substrate.

5. A vacuum processing device according to claim 1, wherein the plurality of vacuum units includes at least one carriage vacuum unit connected to the at least one of the plurality of vacuum units enabling processing, the at least one carriage unit having the means for carrying the substrate accommodated therein.

6. A vacuum processing device according to claim 5, wherein the at least one other of the plurality of infrared radiation thermometers disposed at the different position for measuring a temperature of the substrate at least one of before and after the processing of the substrate is disposed in the at least one carriage vacuum unit.

7. A vacuum processing device according to claim 6, wherein the at least one other of the plurality of infrared radiation thermometers measures a temperature of the substrate both before and after processing of the substrate in the at least one of the plurality of vacuum units enabling processing.

8. A vacuum processing device according to claim 1 further comprising a lamp for heating the substrate, and means for determining heating conditions of the lamp on the basis of an infrared emissivity of the substrate.

9. A vacuum processing device according to claim further comprising means for depositing a film on the substrate.

* * * * *